US009035388B2

(12) United States Patent
Masuoka et al.

(10) Patent No.: US 9,035,388 B2
(45) Date of Patent: May 19, 2015

(54) SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Peninsula Plaza (SG)

( * ) Notice: Subject to any disclaimer, the term of this patent is extended or adjusted under 35 U.S.C. 154(b) by 0 days.

(21) Appl. No.: 14/449,614

(22) Filed: Aug. 1, 2014

(65) Prior Publication Data

US 2014/0339628 A1 Nov. 20, 2014

Related U.S. Application Data

(63) Continuation of application No. 14/044,501, filed on Oct. 2, 2013, now Pat. No. 8,829,619.

(60) Provisional application No. 61/711,329, filed on Oct. 9, 2012.

(51) Int. Cl.
  *H01L 29/06* (2006.01)
  *H01L 29/66* (2006.01)
  *H01L 29/78* (2006.01)

(52) U.S. Cl.
  CPC ...... *H01L 29/0669* (2013.01); *H01L 29/66795* (2013.01); *H01L 29/785* (2013.01); *H01L 29/0692* (2013.01); *H01L 29/7827* (2013.01)

(58) Field of Classification Search
  USPC .......................................... 257/365; 438/283
  See application file for complete search history.

(56) References Cited

U.S. PATENT DOCUMENTS

| 7,205,604 B2 | 4/2007 | Ouyang et al. |
| 2014/0070326 A1* | 3/2014 | Masuoka et al. ............ 257/368 |
| 2014/0091403 A1 | 4/2014 | Masuoka et al. |

FOREIGN PATENT DOCUMENTS

| JP | H02-071556 | 3/1990 |
| JP | H02-188966 | 7/1990 |
| JP | H03-145761 | 6/1991 |
| JP | 2009-182317 | 8/2009 |

(Continued)

OTHER PUBLICATIONS

International Search Report for PCT/JP2012/076106 dated Nov. 13, 2012, 5 pages, (Not in English).
Wu et al., "High Performance 22/20nm FinFET CMOS Devices with Advanced High-K/Metal Gate Scheme", *IEDM2010 CC*, 2010, pp. 27.1.1-27.1.4.
Yang, B., et al., "Vertical Silicon-Nanowire Formation and Gate-All-Around MOSFET", *IEEE Electron Device Letters*, vol. 29, No. 7, Jul. 2008, pp. 791-794.

(Continued)

*Primary Examiner* — Marc Armand
(74) *Attorney, Agent, or Firm* — Brinks Gilson & Lione

(57) ABSTRACT

A semiconductor device includes a fin-shaped silicon layer on a silicon substrate and a first insulating film around the fin-shaped silicon layer. A pillar-shaped silicon layer resides on the fin-shaped silicon layer. A gate electrode and gate insulating film surround the pillar-shaped silicon layer and a gate line is connected to the gate electrode and extends in a direction orthogonally intersecting the fin-shaped silicon layer. A first diffusion layer resides in an upper portion of the pillar-shaped silicon layer and a second diffusion layer resides in an upper portion of the fin-shaped silicon layer and a lower portion of the pillar-shaped silicon layer. A first silicide resides in an upper portion of the first diffusion layer and a second silicide resides in an upper portion of the second diffusion layer. A contact and metal wire are on the second silicide, and a metal wire is on the first contact.

3 Claims, 31 Drawing Sheets

(56) References Cited

FOREIGN PATENT DOCUMENTS

| JP | 2010-258345 | 1/2010 |
|----|-------------|--------|
| JP | 2011-040682 | 2/2011 |
| JP | 2012-004244 | 1/2012 |

OTHER PUBLICATIONS

Notice of Allowance for U.S. Appl. No. 14/044,501 dated Jul. 3, 2014, 6 pages.

* cited by examiner

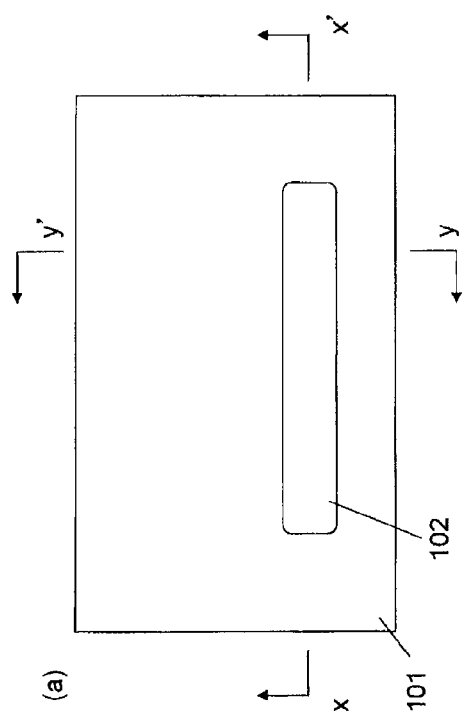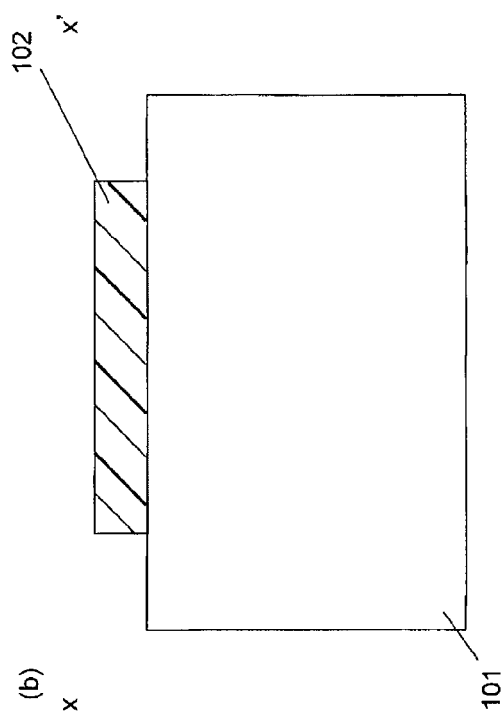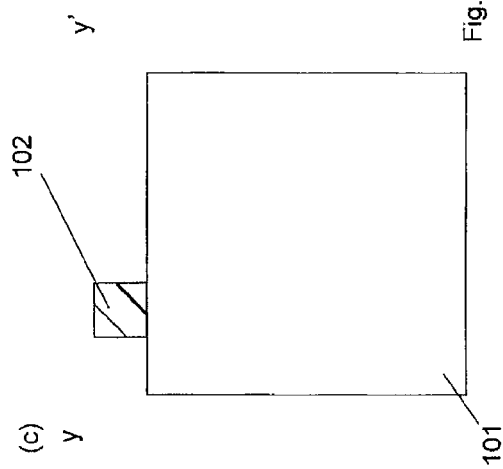
Fig.2

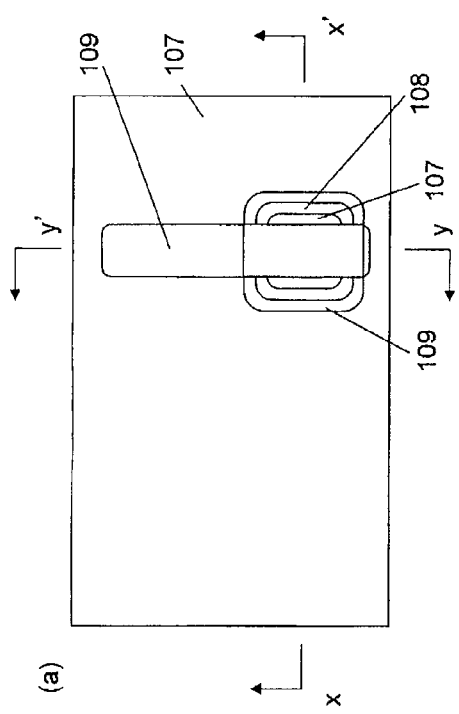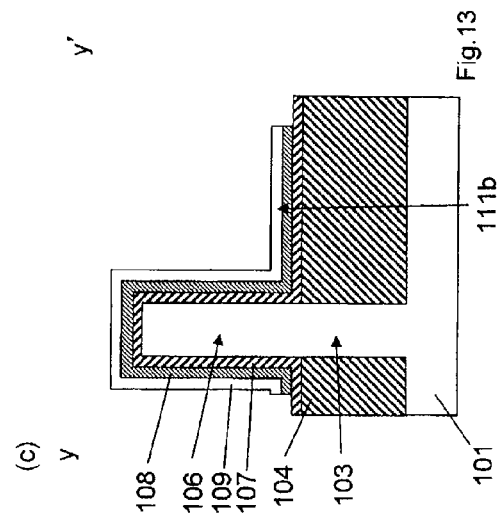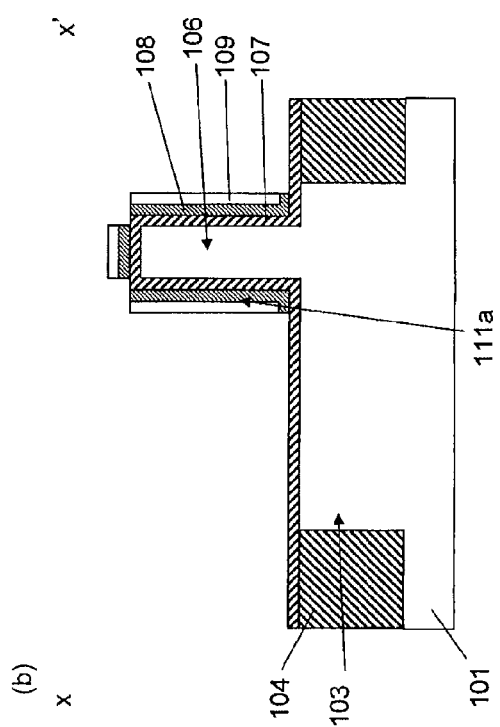
Fig.13

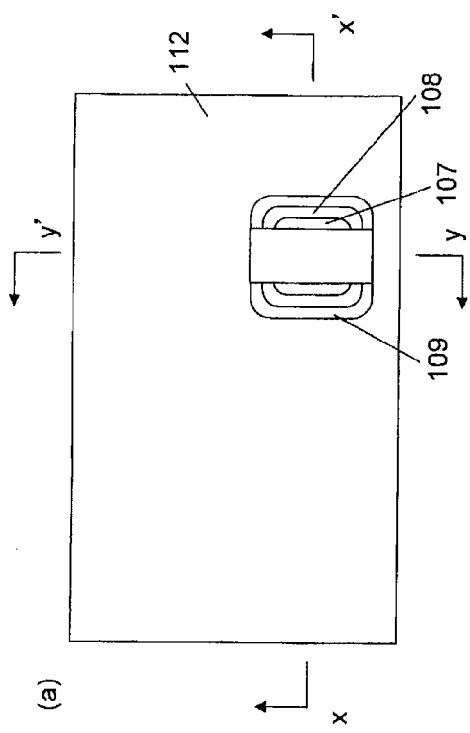
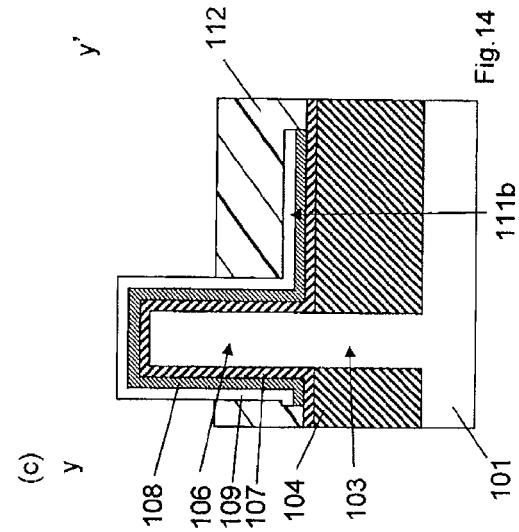
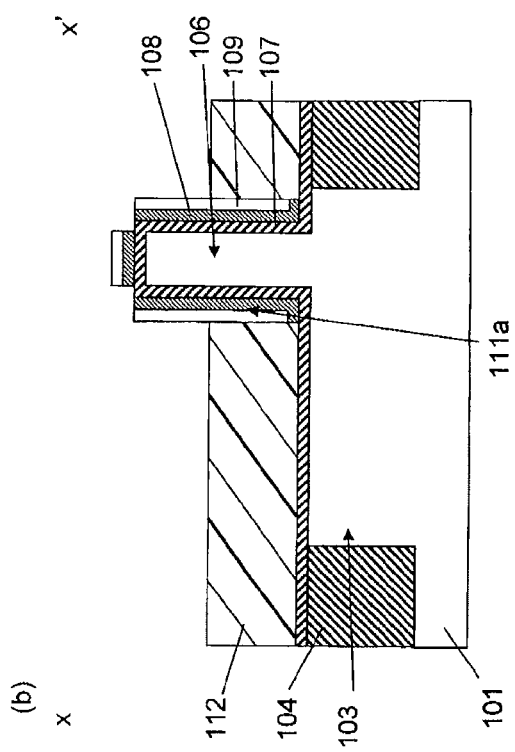
Fig. 14

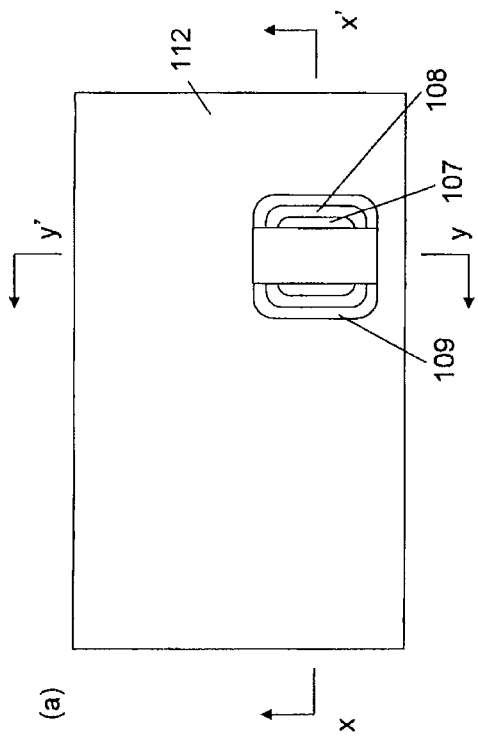
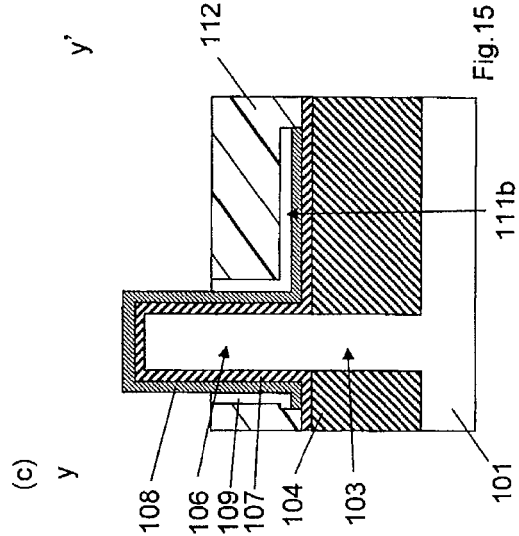
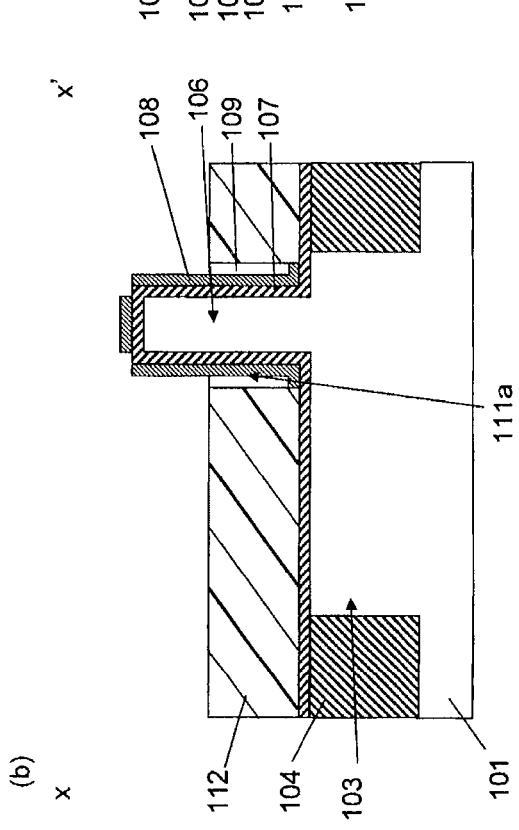
Fig.15

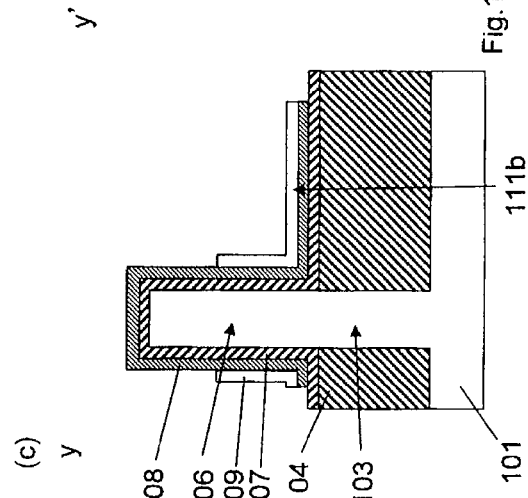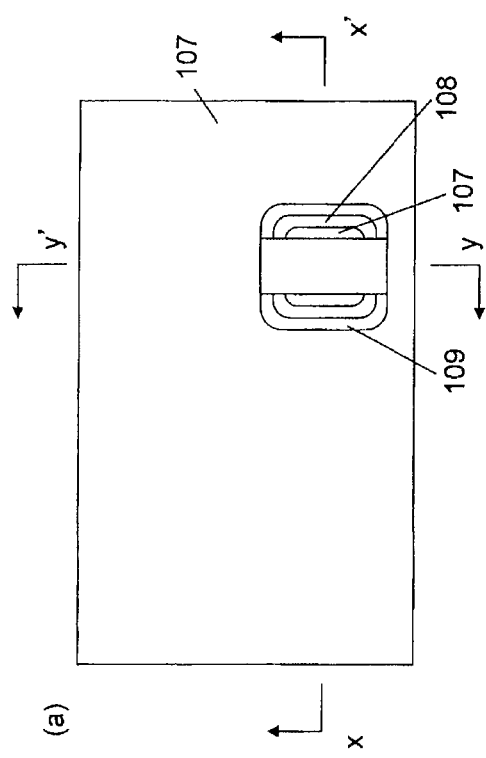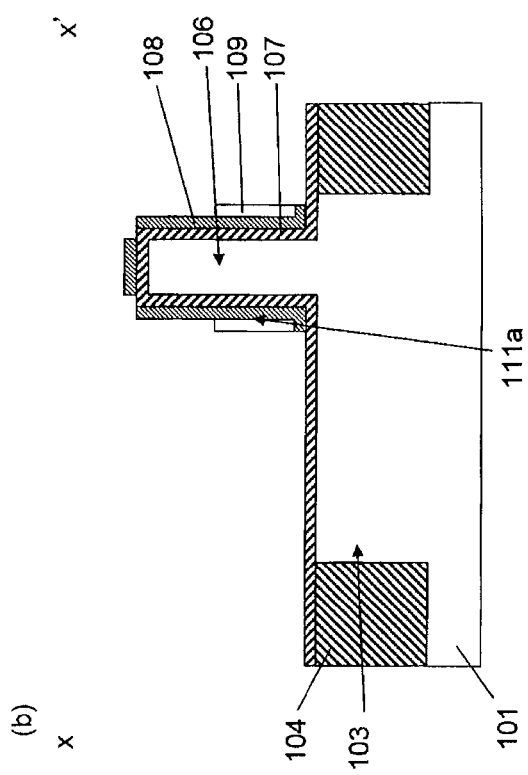
Fig. 16

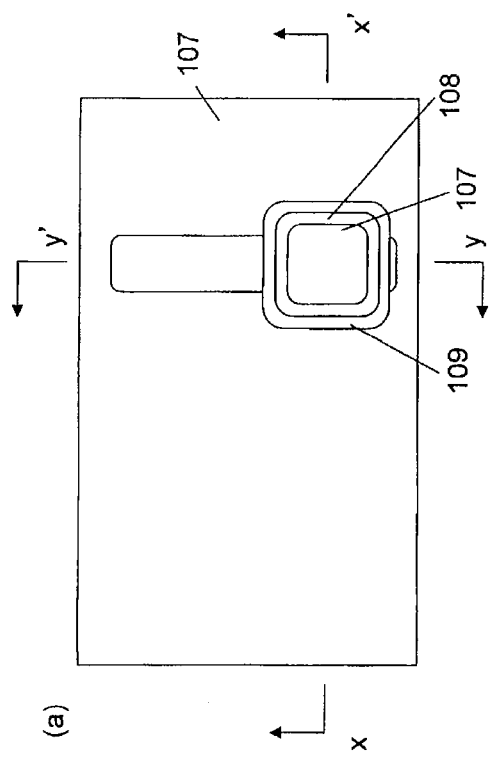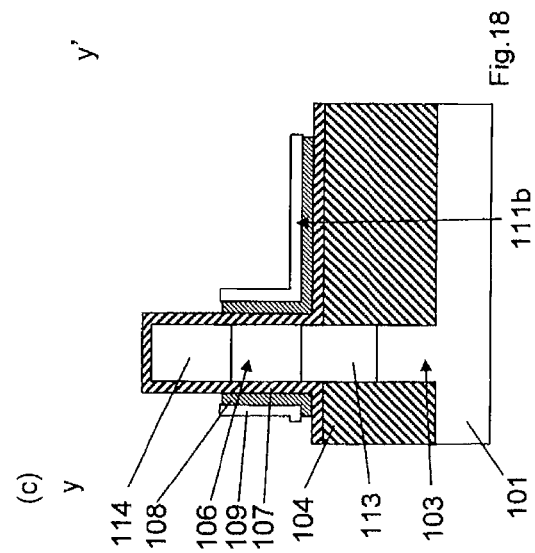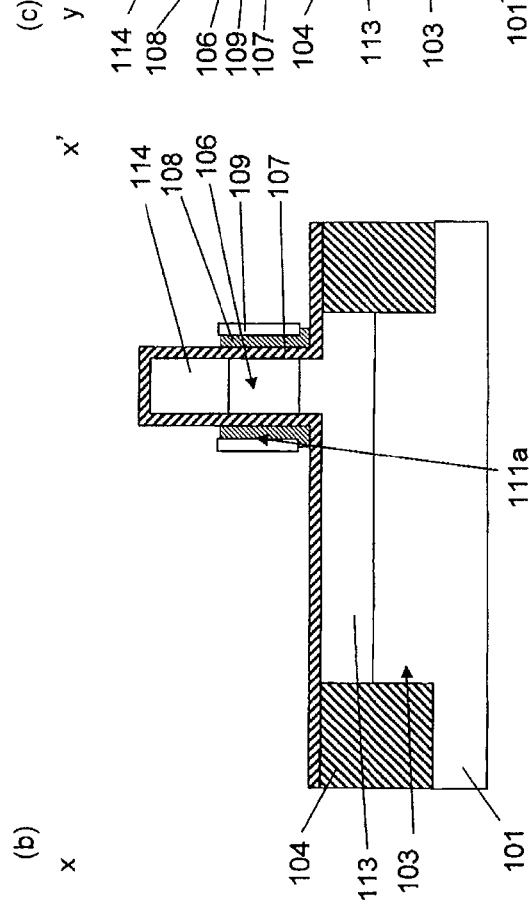
Fig.18

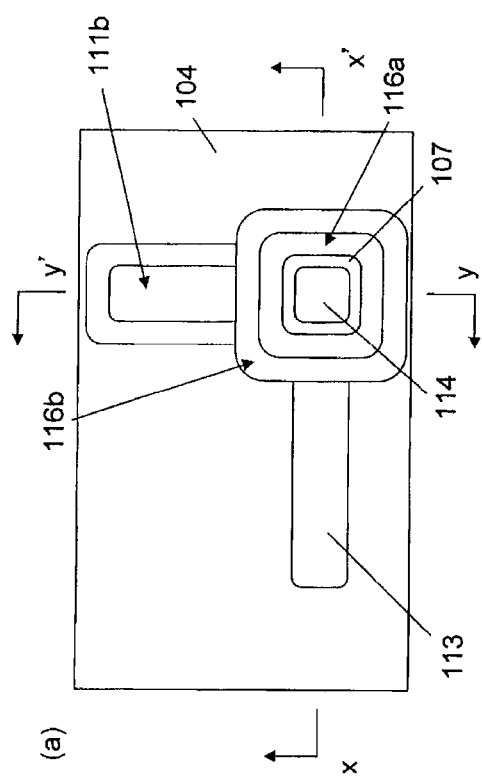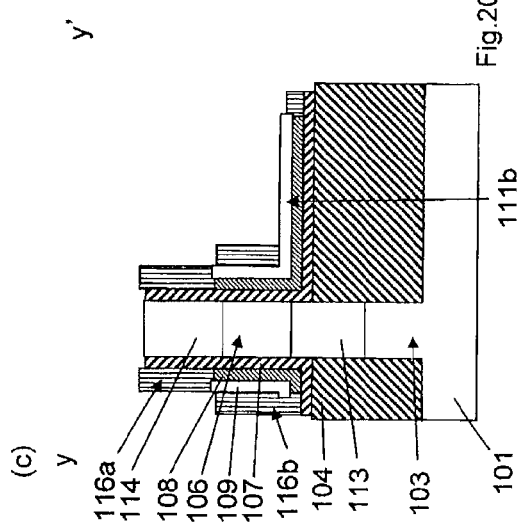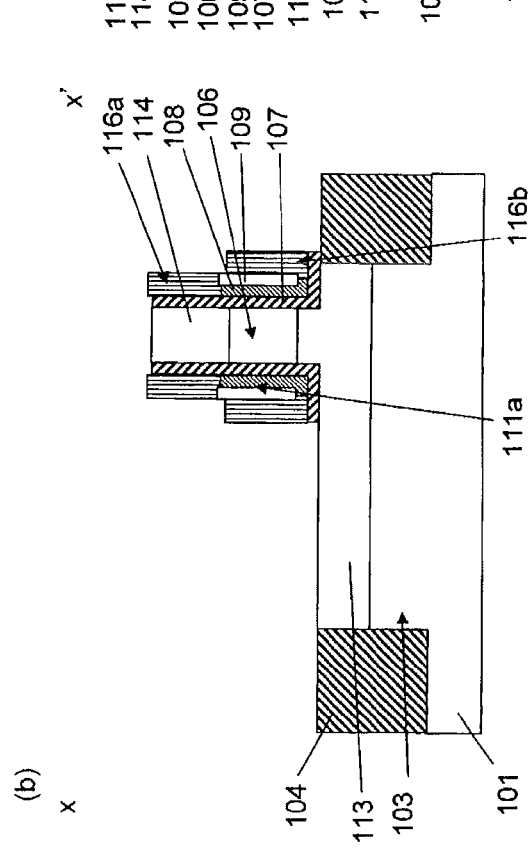
Fig. 20

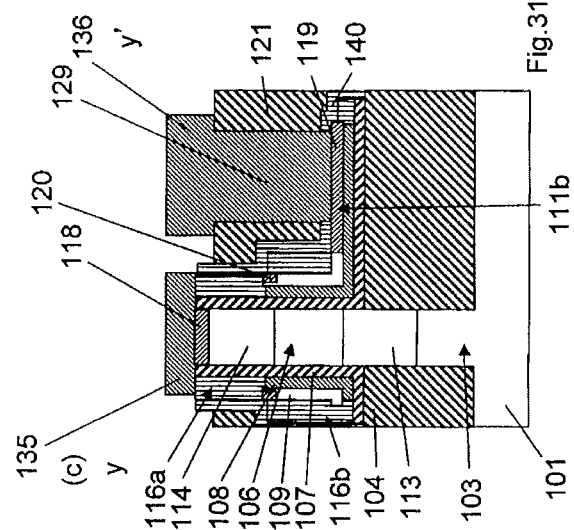
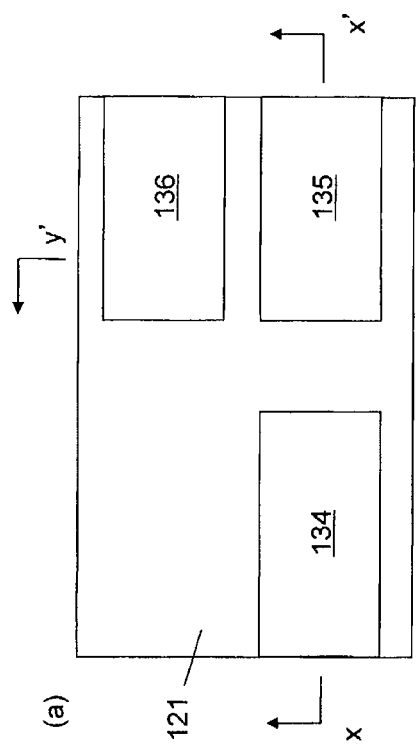
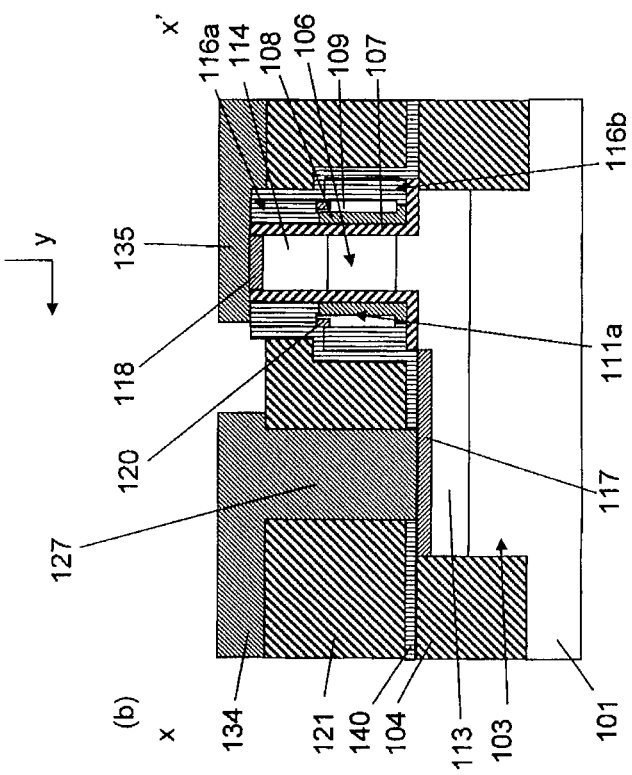
Fig. 31

SEMICONDUCTOR DEVICE

RELATED APPLICATIONS

This application is a continuation patent application of U.S. patent application Ser. No. 14/044,501, filed Oct. 2, 2013, which claims benefit of Provisional U.S. Patent Application Ser. No. 61/711,329, filed Oct. 9, 2012 pursuant to 35 U.S.C. §119(e), the entire contents of which are hereby incorporated by reference.

BACKGROUND

1. Field of the Invention

The present invention relates to a semiconductor device.

2. Description of the Related Art

Increasingly higher degrees of integration continue to be achieved in semiconductor integrated circuits, especially integrated circuits that use MOS transistors. With the increase in the degree of integration, MOS transistors used in integrated circuits have scaled down to the nanometer order. As the miniaturization of the MOS transistors proceeds, it is becoming increasingly difficult to suppress leak current and to reduce the area occupied by the circuits while maintaining a required amount of current. In order to address these challenges, surrounding gate transistors (referred to as "SGTs" hereinafter) in which a source, a gate, and a drain are arranged in a direction perpendicular to a substrate and a gate electrode surrounds a pillar-shaped semiconductor layer have been proposed (for example, refer to Japanese Unexamined Patent Application Nos. 2-71556, 2-188966, and 3-145761).

According to a conventional method for producing SGTs, a contact hole in an upper portion of a silicon pillar is formed separately from a contact hole in a lower portion of the silicon pillar and on a planar silicon layer since the depths of these contacts are different from each other (for example, refer to Japanese Unexamined Patent Application Publication No. 2012-004244). Since the contact holes are formed separately, the number of steps is increased.

While the contact hole in the upper portion of a silicon pillar is formed separately from the contact hole in the lower portion of the silicon pillar and on the planar silicon layer, excessively etching the contact hole in the upper portion of the silicon pillar may result in etching of a gate electrode. If etching is insufficient, there is a possibility that the silicon pillar upper portion is insulated from the contact.

Since the contact hole in the lower portion of the silicon pillar and on the planar silicon layer is deep, it is difficult to fill the contact hole. Moreover, it is difficult to form a deep contact hole.

According to a conventional method for producing SGTs, a silicon pillar in which a nitride film hard mask is formed to have a pillar shape is formed, a diffusion layer is formed in a lower portion of the silicon pillar, a gate material is then deposited, planarized and etched back, and an insulating film side wall is formed on a side wall of the silicon pillar and the nitride film hard mask. Then a resist pattern for a gate line is formed, the gate material is etched, the nitride film hard mask is removed, and a diffusion layer is formed in an upper portion of the silicon pillar (for example, refer to Japanese Unexamined Patent Application No. 2009-182317).

In this method, in the cases where intervals between silicon pillars are narrow and a thick gate material must be deposited between the silicon pillars, holes called voids are sometimes formed between the silicon pillars. Formation of voids leads to formation of holes in the gate material after etch back. When an insulating film is deposited to form the insulating film side wall, the insulating film is deposited in the voids. Accordingly, it becomes more difficult to work with the gate material.

To address this, a proposal has been made (for example, refer to B. Yang, K. D. Buddharaju, S. H. G. Teo, N. Singh, G. D. Lo, and D. L. Kwong, "Vertical Silicon-Nanowire Formation and Gate-All-Around MOSFET", IEEE Electron Device Letters, VOL. 29, No. 7, July 2008, pp. 791-794) in which a gate oxide film is formed after formation of a silicon pillar, a thin polysilicon is deposited, a resist covering an upper portion of the silicon pillar and for forming a gate line is then formed, a gate line is etched, an oxide film is then thickly deposited, the upper portion of the silicon pillar is exposed, the thin polysilicon on the upper portion of the silicon pillar is removed, and the thick oxide film is removed by wet etching.

However, a method in which a metal is used in the gate electrode is not described. Moreover, a resist covering an upper portion of the silicon pillar and for forming a gate line must be formed and the upper portion of the silicon pillar must be covered; thus, this method is not a self-aligned process.

In order to decrease the parasitic capacitance between the gate line and the substrate, a conventional MOS transistor uses a first insulating film. For example, in a FINFET (High performance 22/20 nm FinFET CMOS devices with advanced high-K/metal gate scheme, IEDM 2010 CC. Wu, et. al, 27.1.1-27.1.4), a first insulating film is formed around one fin-shaped semiconductor layer and is etched back to expose the fin-shaped semiconductor layer so as to decrease the parasitic capacitance between the gate line and the substrate. Thus, the first insulating film must be used to decrease the parasitic capacitance between the gate line and the substrate in the SGT also. Since a SGT includes a pillar-shaped semiconductor layer in addition to a fin-shaped semiconductor layer, adjustment must be made for forming the pillar-shaped semiconductor layer.

SUMMARY

Accordingly, an object is to provide a SGT in which a parasitic capacitance between a gate line and a substrate is reduced, no contact is formed in an upper portion of a pillar-shaped silicon layer, and a metal wire is directly connected to the upper portion of the pillar-shaped silicon layer, and a structure of a SGT obtained by the method.

A semiconductor device according to the present invention includes a fin-shaped silicon layer formed on a silicon substrate; a first insulating film formed around the fin-shaped silicon layer; a pillar-shaped silicon layer formed on the fin-shaped silicon layer, where a width of the pillar-shaped silicon layer is equal to a width of the fin-shaped silicon layer; a gate insulating film formed around the pillar-shaped silicon layer; a gate electrode formed around the gate insulating film; a gate line connected to the gate electrode and extending in a direction orthogonally intersecting the fin-shaped silicon layer; a first diffusion layer formed in an upper portion of the pillar-shaped silicon layer; a second diffusion layer formed in an upper portion of the fin-shaped silicon layer and a lower portion of the pillar-shaped silicon layer; a first silicide formed in an upper portion of the first diffusion layer; a second silicide formed in an upper portion of the second diffusion layer; a first contact formed on the second silicide; a first metal wire formed on the first silicide; and a second metal wire formed on the first contact.

The semiconductor device also includes a gate electrode having a multilayered structure constituted by a metal film and a polysilicon film formed around the gate insulating film.

The thickness of the polysilicon film is smaller than the width of the pillar-shaped silicon layer.

The depth of the first contact is smaller than the height of the pillar-shaped silicon layer.

A method for producing a semiconductor device according to the present invention includes a first step of forming a fin-shaped silicon layer on a silicon substrate, forming a first insulating film around the fin-shaped silicon layer, and forming a pillar-shaped silicon layer in an upper portion of the fin-shaped silicon layer; a second step of forming a gate insulating film around the pillar-shaped silicon layer, a gate electrode around the gate insulating film, and a gate line connected to the gate electrode; a third step of forming a first diffusion layer in an upper portion of the pillar-shaped silicon layer and a second diffusion layer in a lower portion of the pillar-shaped silicon layer and an upper portion of the fin-shaped silicon layer; a fourth step of forming a first silicide and a second silicide on the first diffusion layer and the second diffusion layer; and after the fourth step, a fifth step of depositing an interlayer insulating film, planarizing and etching-back the interlayer insulating film to expose an upper portion of the pillar-shaped silicon layer, forming a fifth resist for forming a first contact after the upper portion of the pillar-shaped silicon layer is exposed, etching the interlayer insulating film to form a contact hole, depositing a metal to form the first contact on the second silicide, forming a sixth resist for forming a metal wire, and performing the etching to form the metal wire.

In the first step, a width of the pillar-shaped silicon layer is equal to a width of the fin-shaped silicon layer.

In the first step, a first resist for forming the fin-shaped silicon layer is formed on the silicon substrate, the silicon substrate is etched to form the fin-shaped silicon layer, and the first resist is removed; and a first insulating film is deposited around the fin-shaped silicon layer and etched-back to expose an upper portion of the fin-shaped silicon layer, a second resist is formed so as to orthogonally intersect the fin-shaped silicon layer, the fin-shaped silicon layer is etched, and the second resist is removed so that a portion where the fin-shaped silicon layer orthogonally intersects the second resist forms the pillar-shaped silicon layer.

In the second step, the gate insulating film is formed around the pillar-shaped silicon layer, a metal film and a polysilicon film having a thickness smaller than a width of the pillar-shaped silicon layer are formed around the gate insulating film, a third resist for forming a gate line is formed, and anisotropic etching is performed to form the gate line. A fourth resist is deposited, the polysilicon film at an upper side wall of the pillar-shaped silicon layer is exposed, the exposed polysilicon film is removed by etching, the fourth resist is removed, the metal film is removed by etching, and a gate electrode connected to the gate line is formed.

ADVANTAGEOUS EFFECTS OF INVENTION

According to the present invention, a method for producing a SGT in which a parasitic capacitance between a gate line and a substrate is reduced, no contact is formed in an upper portion of a pillar-shaped silicon layer, and a metal wire is directly connected to the upper portion of the pillar-shaped silicon layer, and a structure of a SGT obtained by the method can be provided.

Since the metal wire is directly connected to the upper portion of the pillar-shaped silicon layer, a step of forming a contact in the upper portion of the pillar-shaped silicon layer is no longer needed.

Since the metal wire is directly connected to the upper portion of the pillar-shaped silicon layer, the depth of the contact hole for a first contact can be decreased. Thus, the contact hole can be easily formed and filled with a metal.

Moreover, since production of the fin-shaped silicon layer, the first insulating film, and the pillar-shaped silicon layer is based on the conventional methods for producing FINFETs, the production is easy.

Moreover, a self-aligned process is realized through the second step in which the gate insulating film is formed around the pillar-shaped silicon layer, a metal film and a polysilicon film having a thickness smaller than a width of the pillar-shaped silicon layer are formed around the gate insulating film, a third resist for forming a gate line is formed, and anisotropic etching is performed to form the gate line. A fourth resist is deposited, the polysilicon film at an upper side wall of the pillar-shaped silicon layer is exposed, the exposed polysilicon film is removed by etching, the fourth resist is removed, the metal film is removed by etching, and a gate electrode connected to the gate line is formed. Since the method involves a self-aligned process, higher integration is possible.

BRIEF DESCRIPTION OF THE DRAWING

FIG. 2(a) is a plan view of a semiconductor device according to the present invention. FIG. 2(b) is a cross-sectional view taken along line x-x' in (a). FIG. 2(c) is a cross-sectional view taken along line y-y' in (a).

FIG. 11(a) is a plan view of a semiconductor device according to the present invention. FIG. 11(b) is a cross-sectional view taken along line x-x' in (a). FIG. 11(c) is a cross-sectional view taken along line y-y' in (a).

FIG. 13(a) is a plan view of a semiconductor device according to the present invention. FIG. 13(b) is a cross-sectional view taken along line x-x' in (a). FIG. 13(c) is a cross-sectional view taken along line y-y' in (a).

FIG. 14(a) is a plan view of a semiconductor device according to the present invention. FIG. 14(b) is a cross-sectional view taken along line x-x' in (a). FIG. 14(c) is a cross-sectional view taken along line y-y' in (a).

FIG. 15(a) is a plan view of a semiconductor device according to the present invention. FIG. 15(b) is a cross-sectional view taken along line x-x' in (a). FIG. 15(c) is a cross-sectional view taken along line y-y' in (a).

FIG. 16(a) is a plan view of a semiconductor device according to the present invention. FIG. 16(b) is a cross-sectional view taken along line x-x' in (a). FIG. 16(c) is a cross-sectional view taken along line y-y' in (a).

FIG. 18(a) is a plan view of a semiconductor device according to the present invention. FIG. 18(b) is a cross-sectional view taken along line x-x' in (a). FIG. 18(c) is a cross-sectional view taken along line y-y' in (a).

FIG. 20(a) is a plan view of a semiconductor device according to the present invention. FIG. 20(b) is a cross-sectional view taken along line x-x' in (a). FIG. 20(c) is a cross-sectional view taken along line y-y' in (a).

FIG. 31(a) is a plan view of a semiconductor device according to the present invention. FIG. 31(b) is a cross-sectional view taken along line x-x' in (a). FIG. 31(c) is a cross-sectional view taken along line y-y' in (a).

DETAILED DESCRIPTION

Figure 1:
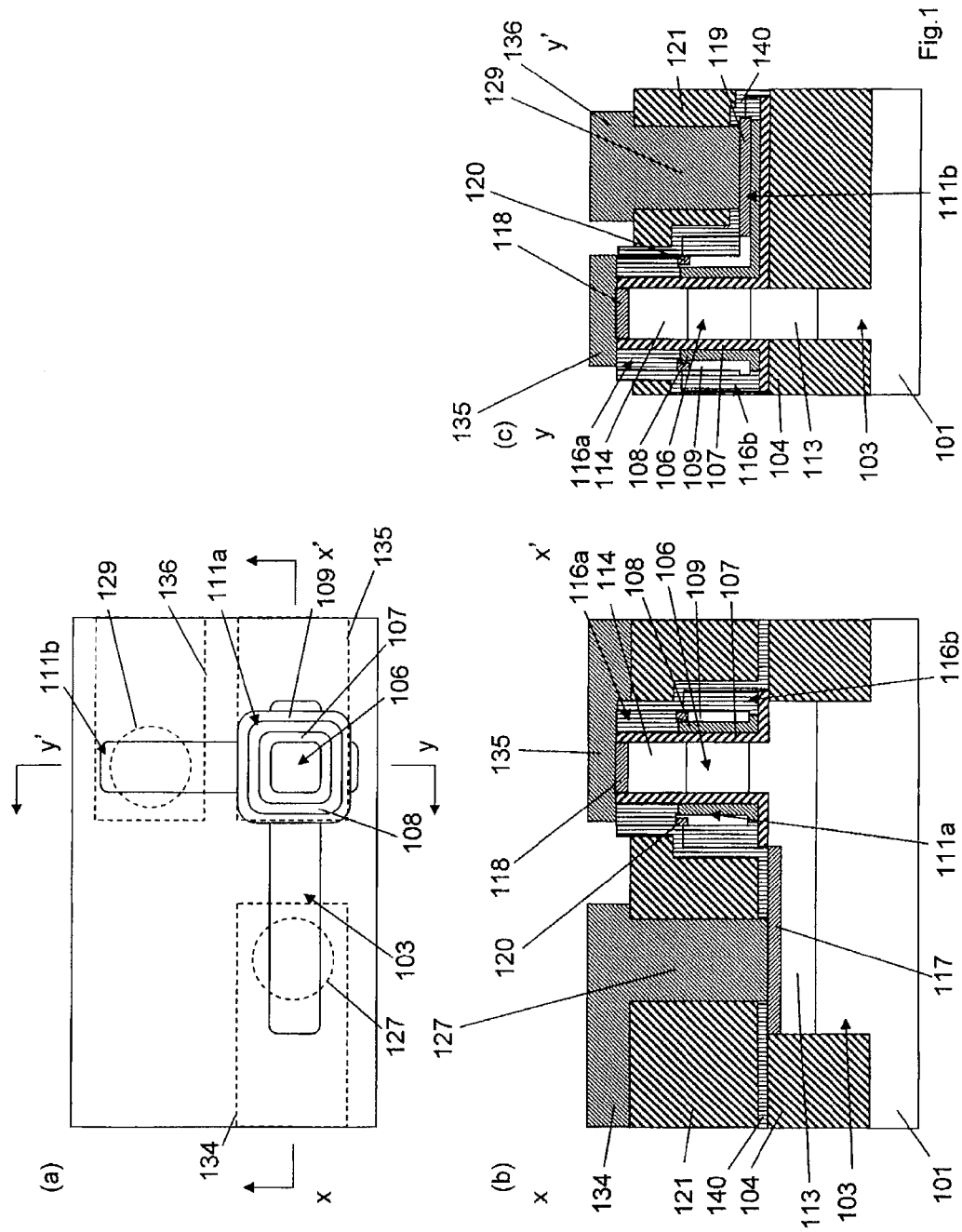
FIG. 1(a) is a plan view of a semiconductor device according to the present invention.
FIG. 1(b) is a cross-sectional view taken along line x-x' in (a).
FIG. 1(c) is a cross-sectional view taken along line y-y' in (a).

Production steps for forming a SGT structure according to an embodiment of the present invention are described below with reference to FIGS. 2 to 31.

First, a production method in which a fin-shaped silicon layer 103 is formed on a silicon substrate 101, a first insulating film 104 is formed around the fin-shaped silicon layer 103, and a pillar-shaped silicon layer 106 is formed in an upper portion of the fin-shaped silicon layer 103 is described. As shown in FIG. 2, a first resist 102 for forming a fin-shaped silicon layer is formed on the silicon substrate 101.

Figure 3:
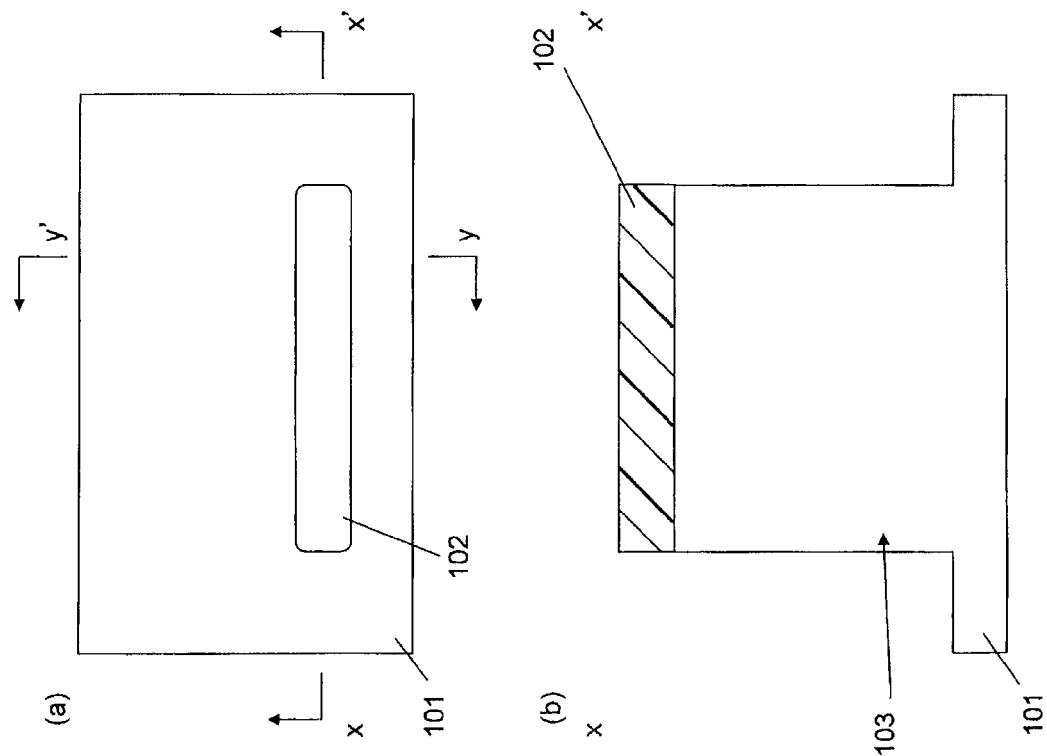
FIG. 3(a) is a plan view of a semiconductor device according to the present invention.
FIG. 3(b) is a cross-sectional view taken along line x-x' in (a).
FIG. 3(c) is a cross-sectional view taken along line y-y' in (a).

As shown in FIG. 3, the fin-shaped silicon layer 103 is formed by etching the silicon substrate 101. Although a resist is used this time as a mask to form a fin-shaped silicon layer, a hard mask such as an oxide film or a nitride film may alternatively be used.

Figure 4:
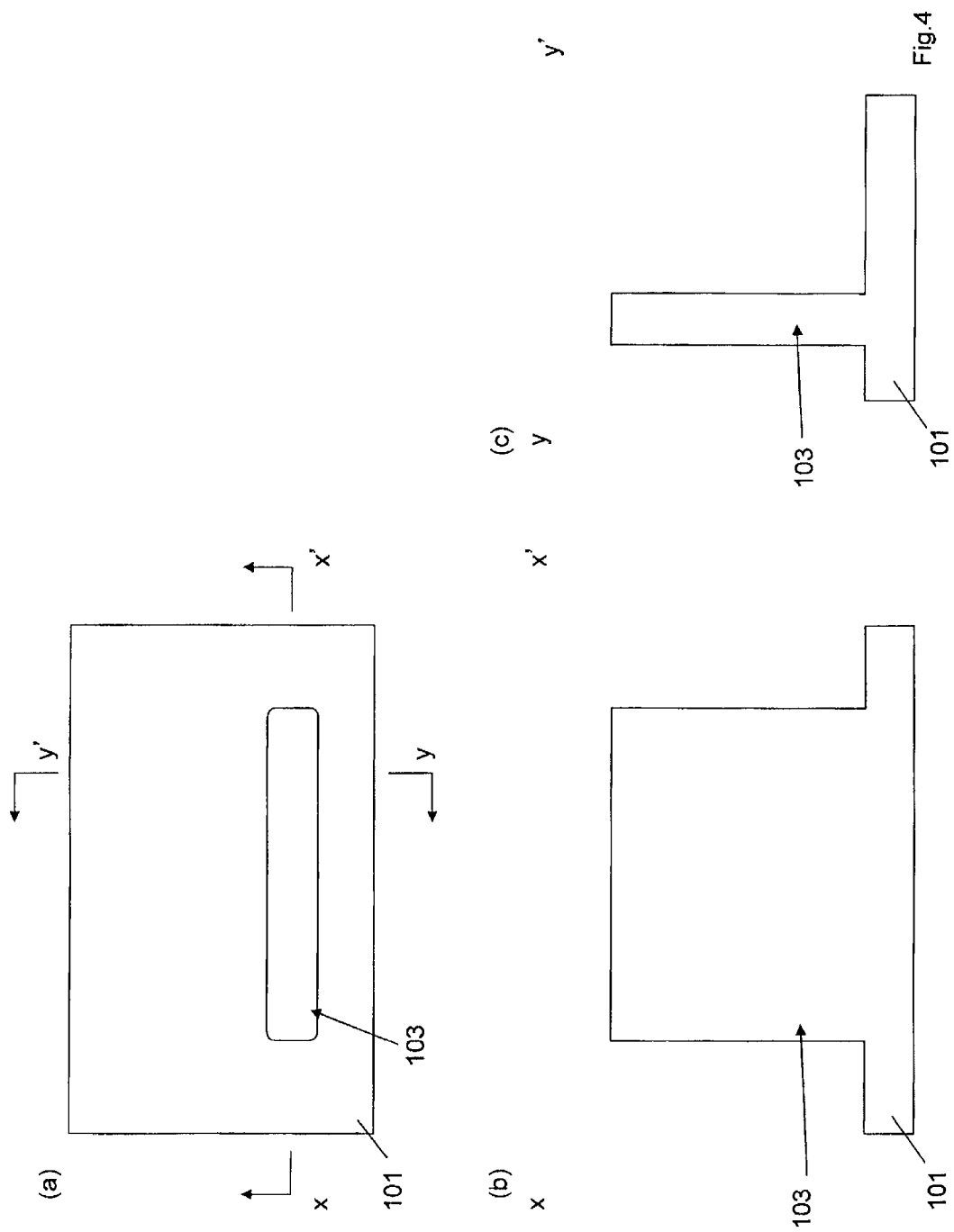
FIG. 4(a) is a plan view of a semiconductor device according to the present invention.
FIG. 4(b) is a cross-sectional view taken along line x-x' in (a).
FIG. 4(c) is a cross-sectional view taken along line y-y' in (a).

As shown in FIG. 4, the first resist 102 is removed.

Figure 5:
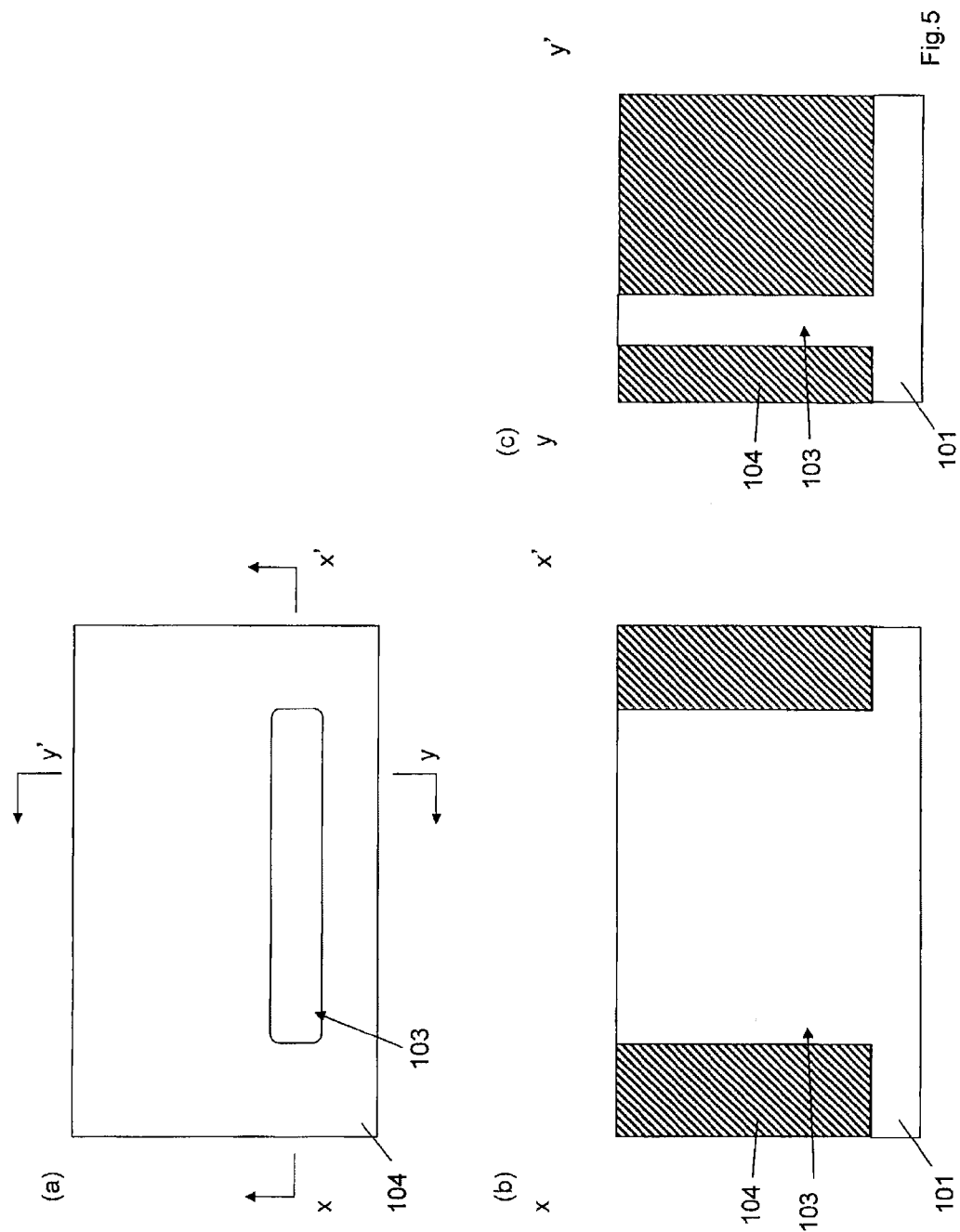
FIG. 5(a) is a plan view of a semiconductor device according to the present invention.
FIG. 5(b) is a cross-sectional view taken along line x-x' in (a).
FIG. 5(c) is a cross-sectional view taken along line y-y' in (a).

As shown in FIG. 5, the first insulating film 104 is deposited around the fin-shaped silicon layer 103. An oxide film formed by high-density plasma or an oxide film formed by low-pressure chemical vapor deposition may be used as the first insulating film, for example.

Figure 6:
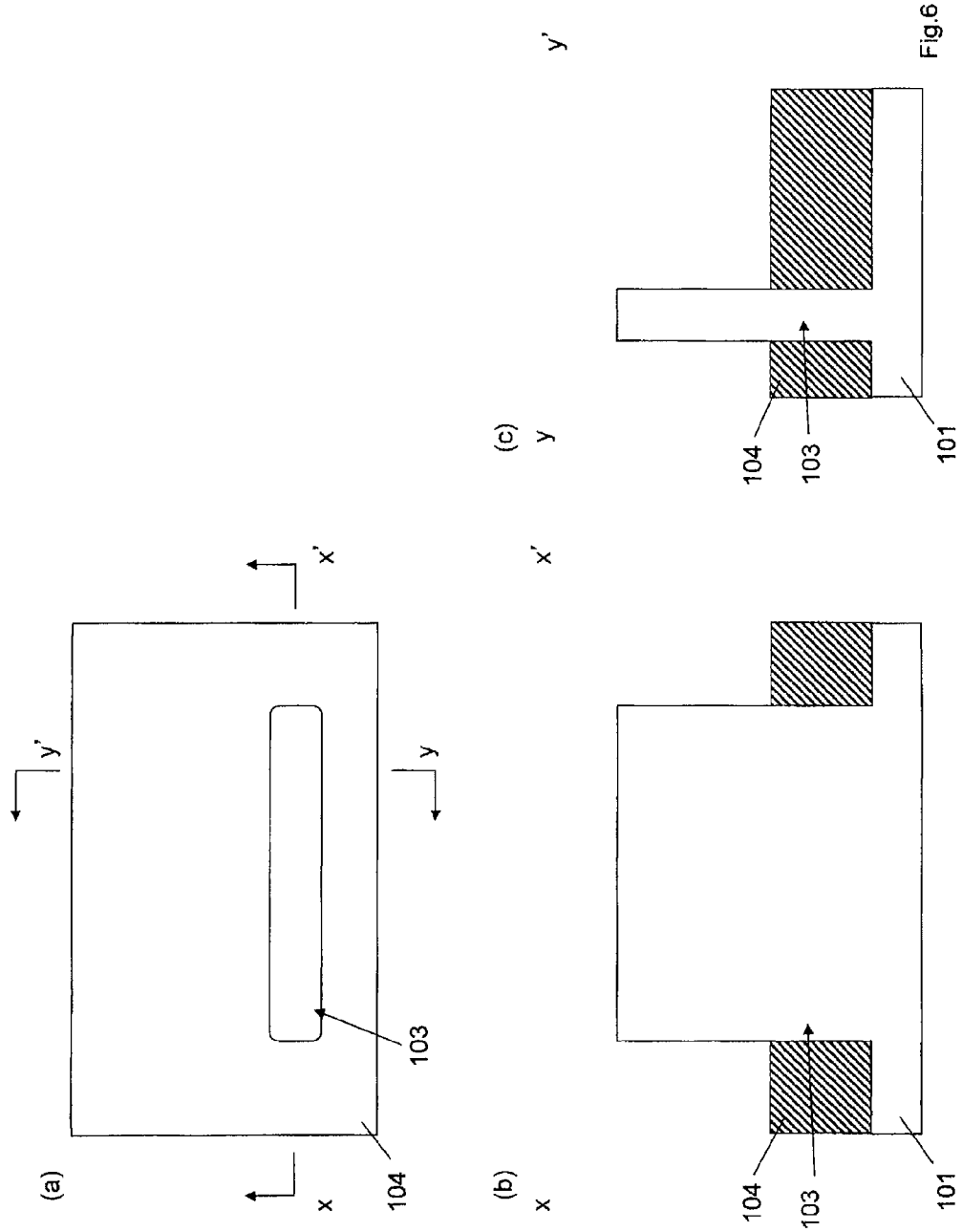
FIG. 6(a) is a plan view of a semiconductor device according to the present invention.
FIG. 6(b) is a cross-sectional view taken along line x-x' in (a).
FIG. 6(c) is a cross-sectional view taken along line y-y' in (a).

As shown in FIG. 6, the first insulating film 104 is etched back to expose an upper portion of the fin-shaped silicon layer 103. The steps up to and including this are the same as those of the method for producing a fin-shaped silicon layer in Non Patent Literature 2.

Figure 7:
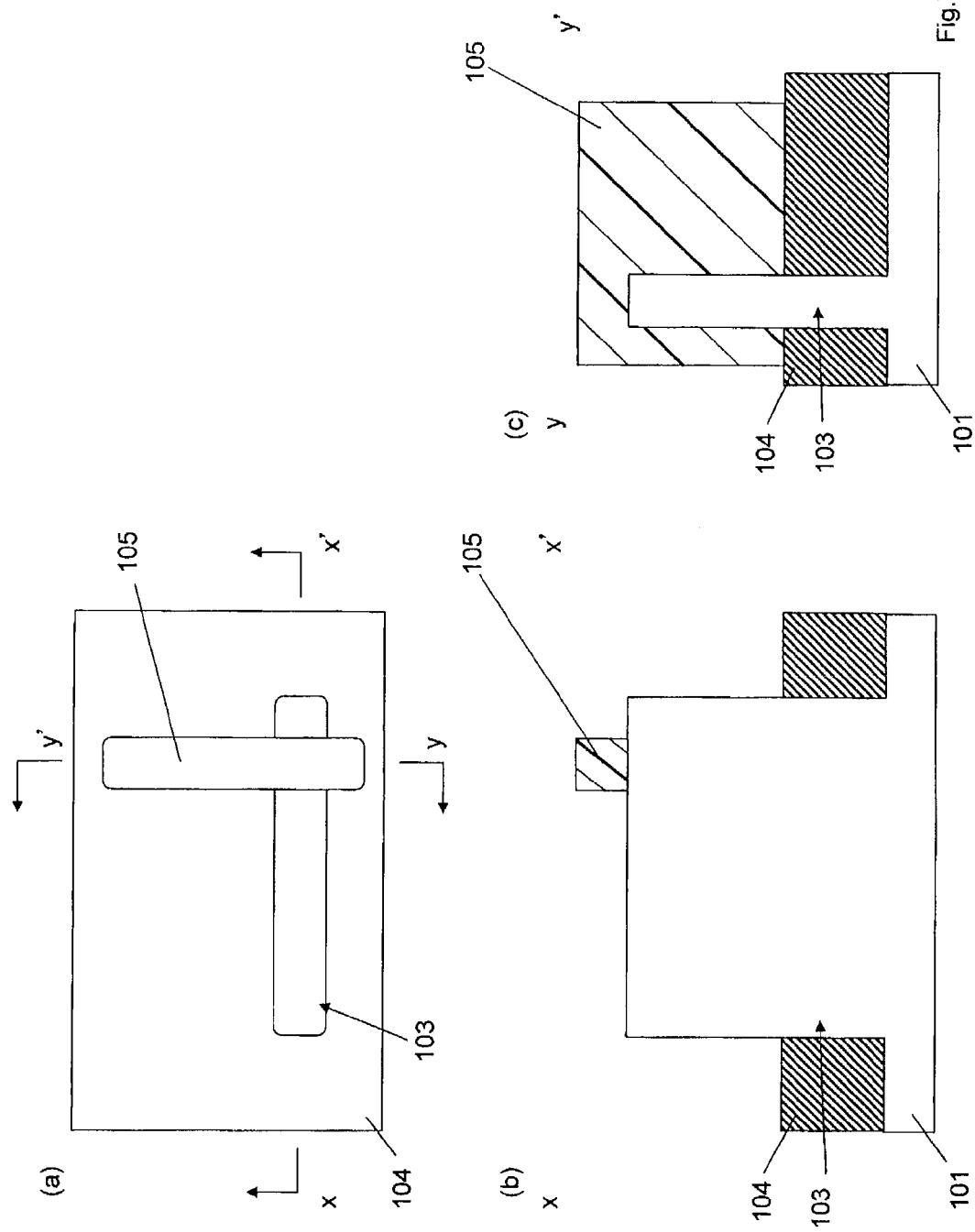
FIG. 7(a) is a plan view of a semiconductor device according to the present invention.
FIG. 7(b) is a cross-sectional view taken along line x-x' in (a).
FIG. 7(c) is a cross-sectional view taken along line y-y' in (a).

As shown in FIG. 7, a second resist 105 is formed so as to orthogonally intersect the fin-shaped silicon layer 103. The part where the fin-shaped silicon layer 103 and the second resist 105 orthogonally intersect is the portion that will form a pillar-shaped silicon layer. Since a line-shaped resist can be used, the possibility of breaking of the resist after patterning is low and the process becomes stable.

Figure 8:
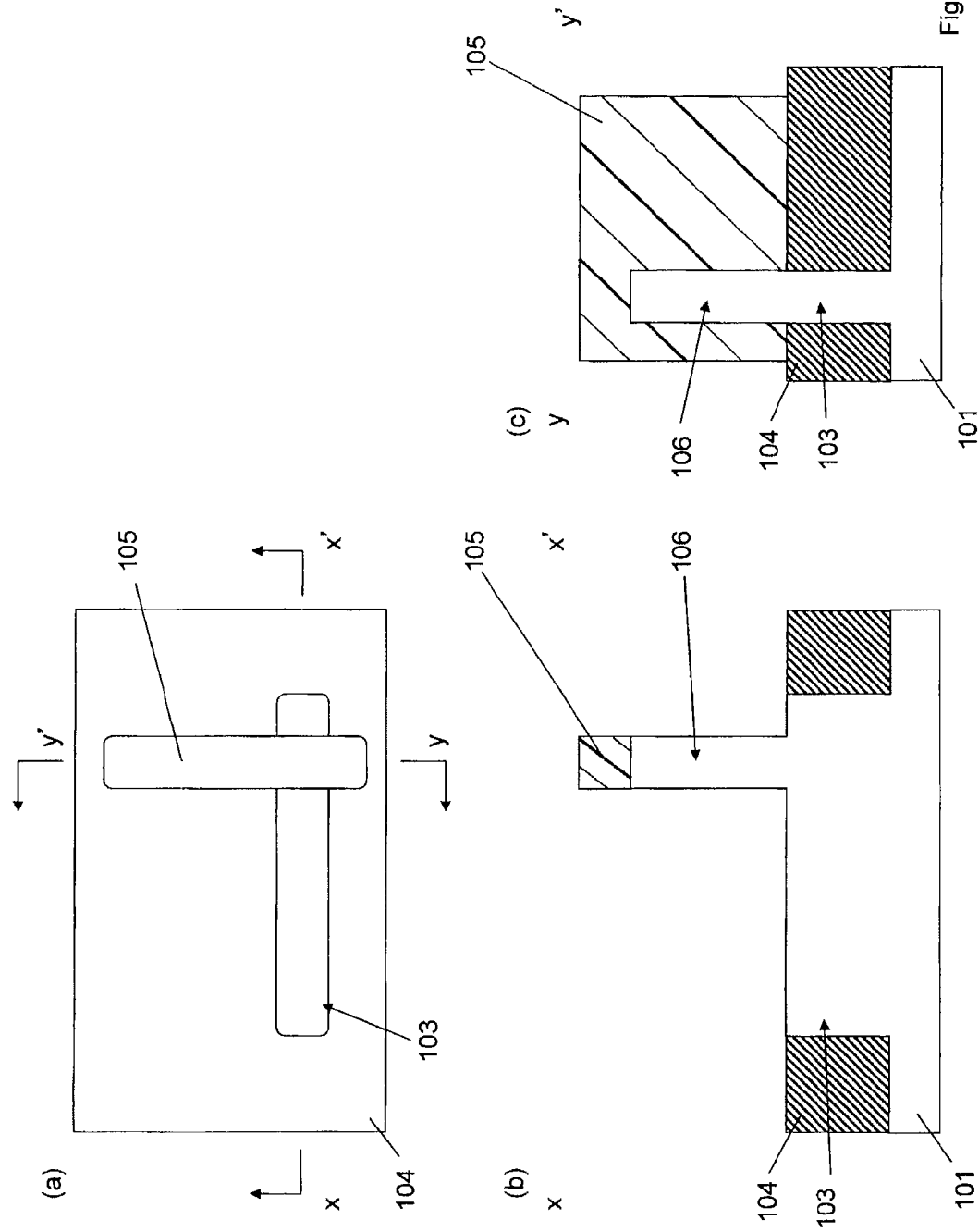
FIG. 8(a) is a plan view of a semiconductor device according to the present invention.
FIG. 8(b) is a cross-sectional view taken along line x-x' in (a).
FIG. 8(c) is a cross-sectional view taken along line y-y' in (a).

As shown in FIG. 8, the fin-shaped silicon layer 103 is etched. The portion where the fin-shaped silicon layer 103 and the second resist 105 orthogonally intersect forms the pillar-shaped silicon layer 106. Accordingly, the width of the pillar-shaped silicon layer 106 is equal to the width of the fin-shaped silicon layer. Thus, a structure is formed in which the pillar-shaped silicon layer 106 is formed in the upper portion of the fin-shaped silicon layer 103 and the first insulating film 104 is formed around the fin-shaped silicon layer 103.

Figure 9:
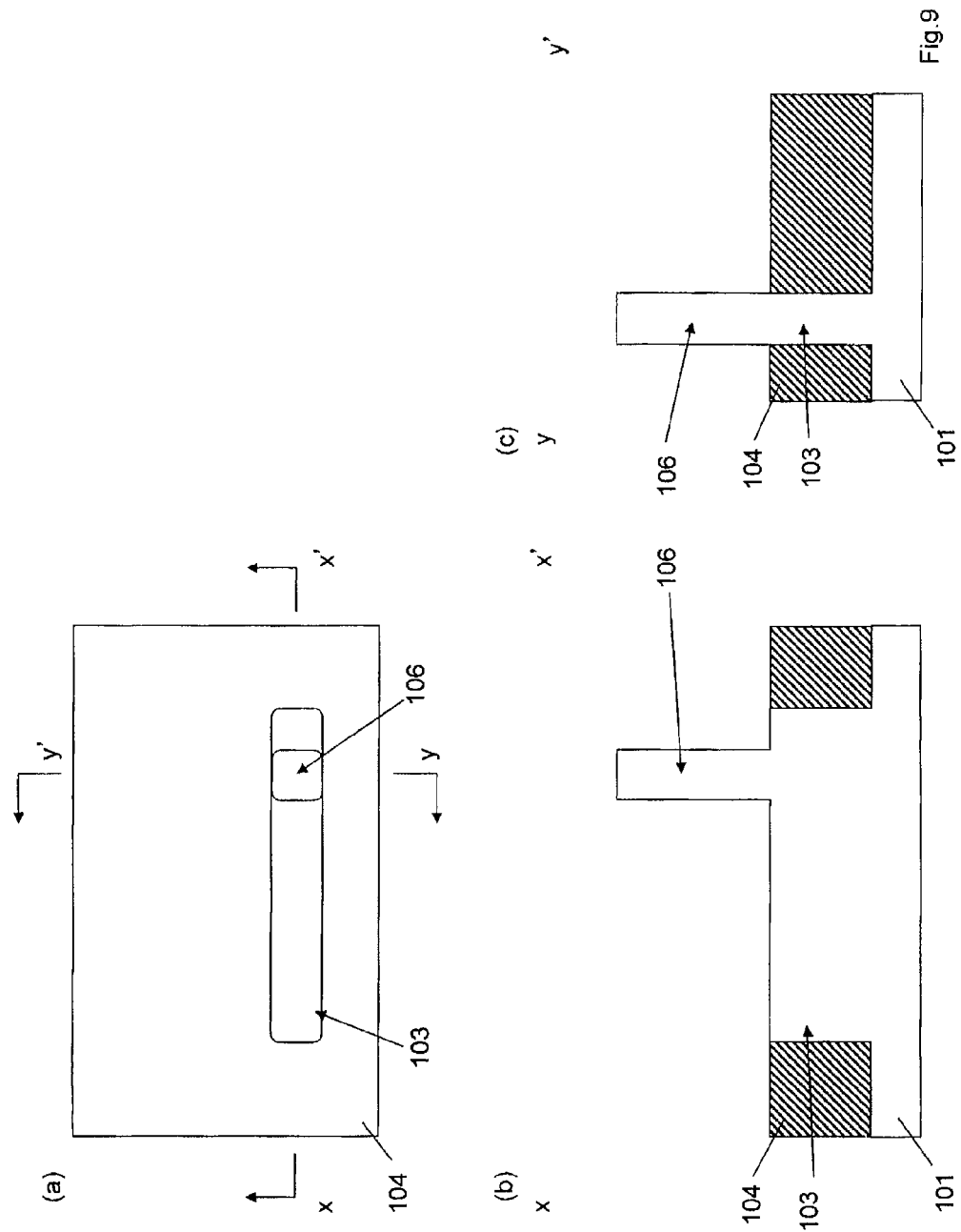
FIG. 9(a) is a plan view of a semiconductor device according to the present invention.
FIG. 9(b) is a cross-sectional view taken along line x-x' in (a).
FIG. 9(c) is a cross-sectional view taken along line y-y' in (a).

As shown in FIG. 9, the second resist 105 is removed.

Next, a production method is described in which a gate insulating film 107 is formed around the pillar-shaped silicon layer 106, a metal film 108 and a polysilicon film 109 having a thickness smaller than the width of the pillar-shaped silicon layer are formed around the gate insulating film 107, a third resist 110 for forming a gate line 111*b* is formed and anisotropically etched to form the gate line 111*b*, a fourth resist 112 is then deposited, the polysilicon film 109 on the upper side wall of the pillar-shaped silicon layer 106 is exposed, the exposed polysilicon film 109 is removed by etching, the fourth resist 112 is removed, the metal film 108 is removed by etching, and a gate electrode 111*a* connected to the gate line 111*b* is formed.

Figure 10:
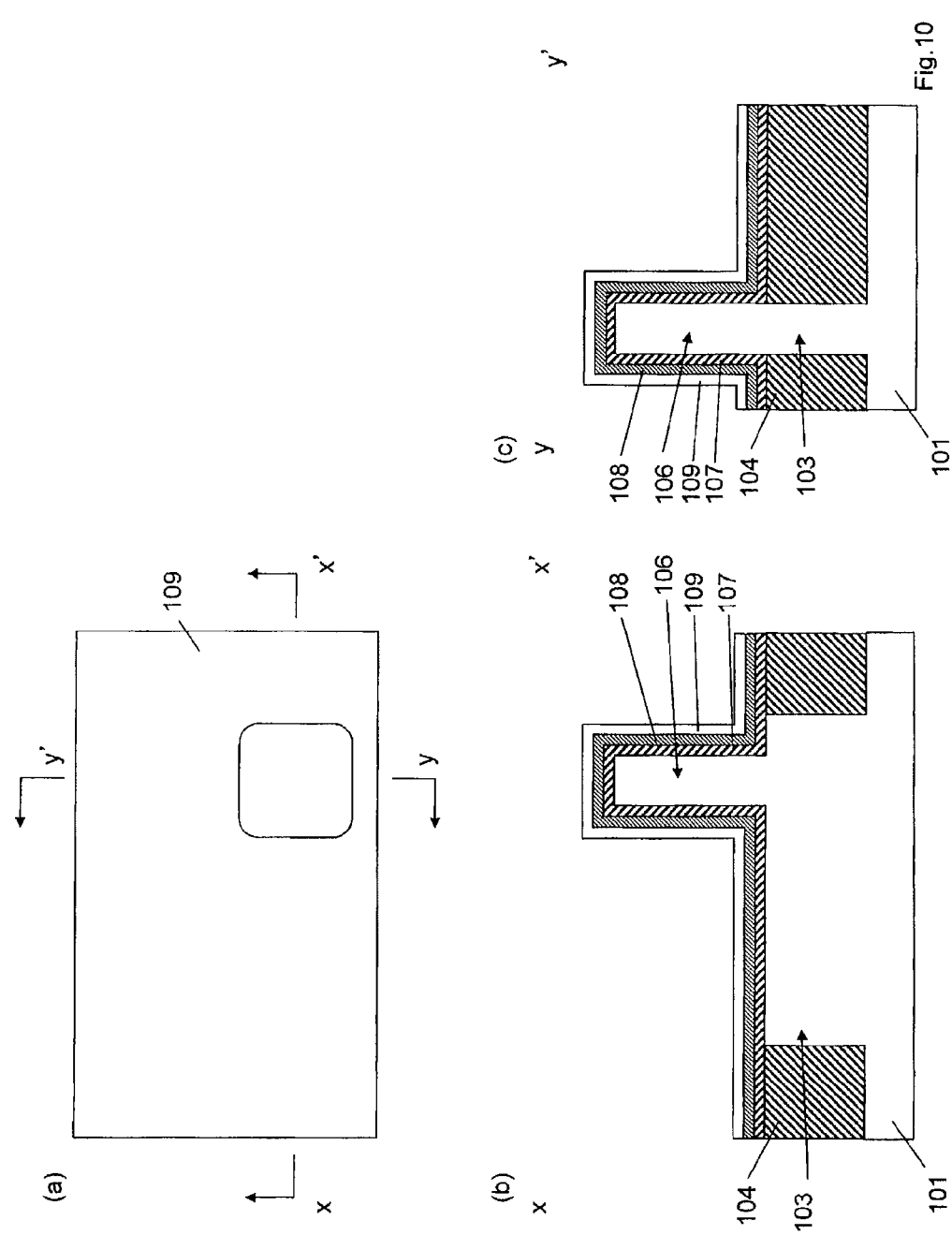
FIG. 10(a) is a plan view of a semiconductor device according to the present invention.
FIG. 10(b) is a cross-sectional view taken along line x-x' in (a).
FIG. 10(c) is a cross-sectional view taken along line y-y' in (a).

As shown in FIG. 10, the gate insulating film 107 is formed around the pillar-shaped silicon layer 106, and the metal film 108 and the polysilicon film 109 are formed around the gate insulating film 107. During this process, a thin polysilicon film 109 is used. Accordingly, formation of voids in the polysilicon film can be prevented. The thickness of the thin polysilicon film 109 is preferably 20 nm or less. The metal film 108 may be composed of any metal, such as titanium nitride, that is used in semiconductor processes and sets the threshold voltage of a transistor. The gate insulating film 107 may be a film, such as an oxide film, an oxynitride film, or a high-k dielectric film, used in semiconductor processes.

Figure 11:
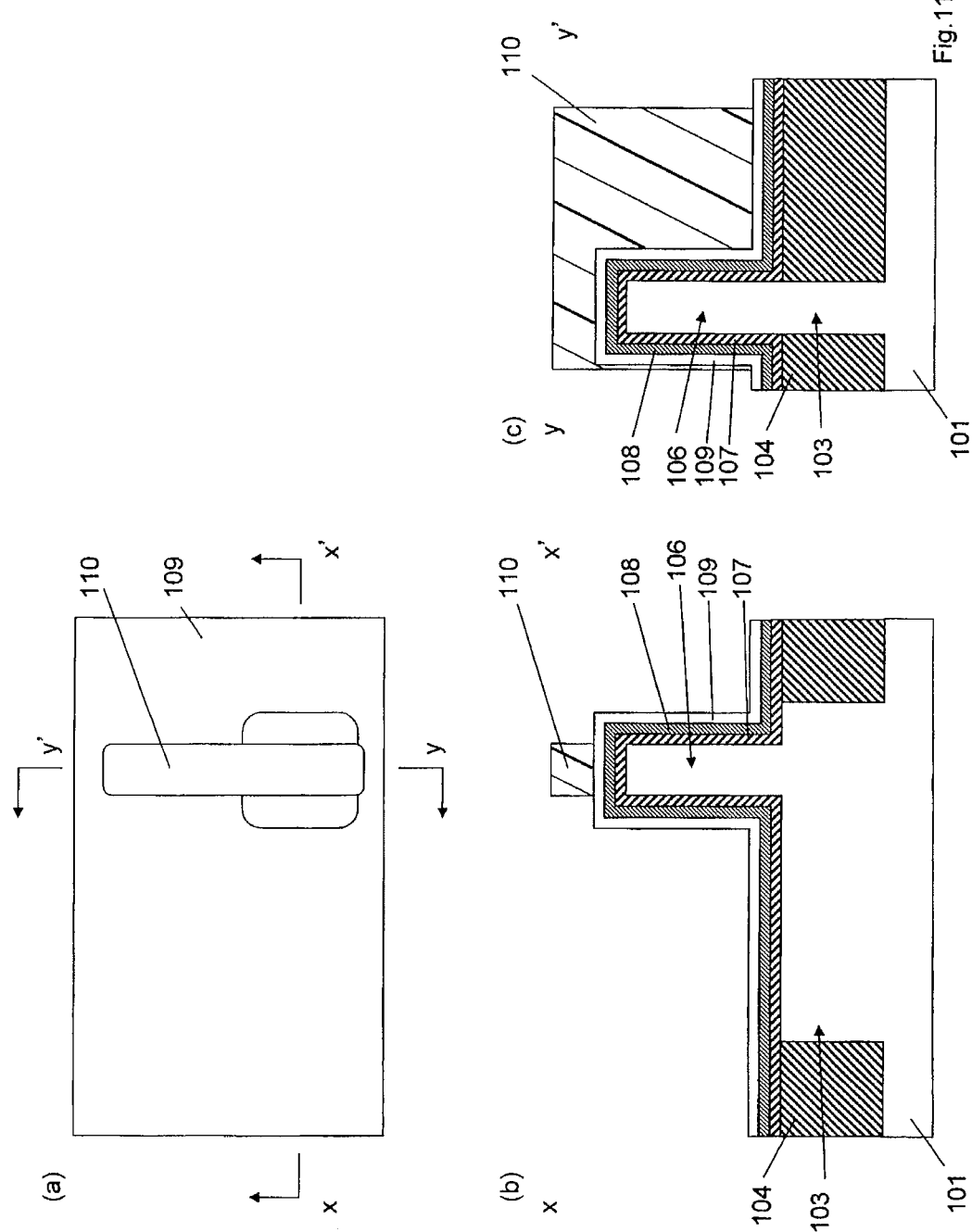

As shown in FIG. 11, the third resist 110 for forming the gate line 111*b* is formed. In this embodiment, the height of the resist is described to be higher than the pillar-shaped silicon layer. The smaller the gate line width, the easier it is for polysilicon in the upper portion of the pillar-shaped silicon layer to be exposed. The height of the resist may be lower than the pillar-shaped silicon layer.

Figure 12:
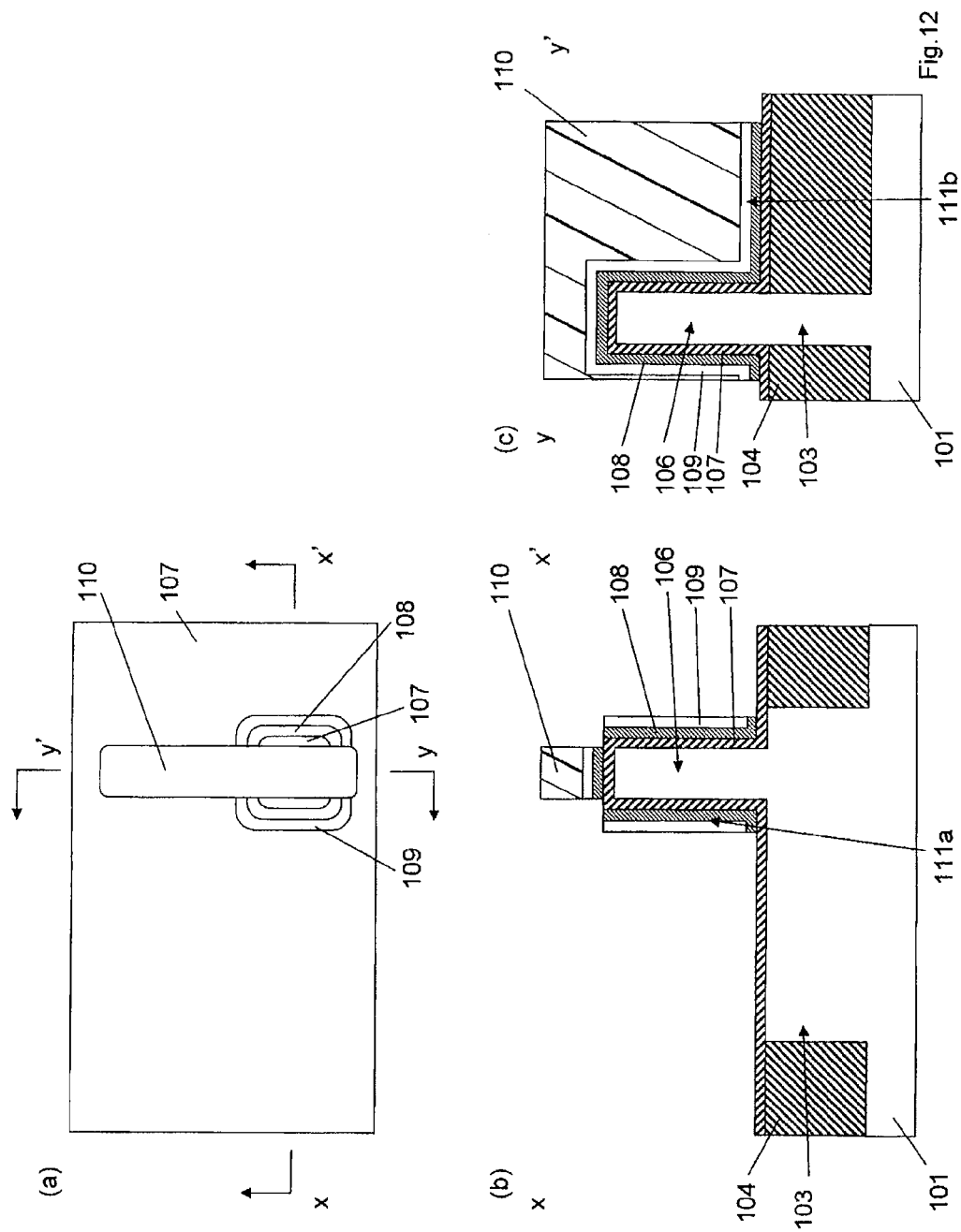
FIG. 12(a) is a plan view of a semiconductor device according to the present invention.
FIG. 12(b) is a cross-sectional view taken along line x-x' in (a).
FIG. 12(c) is a cross-sectional view taken along line y-y' in (a).

As shown in FIG. 12, the polysilicon film 109 and the metal film 108 are etched. The gate electrode 111*a* and the gate line 111*b* are formed. During this process, if the resist on the upper portion of the pillar-shaped silicon layer is thin or the polysilicon in the upper portion of the pillar-shaped silicon layer is exposed, the upper portion of the pillar-shaped silicon layer may become etched during etching. In such a case, the height of the pillar-shaped silicon layer at the time of formation of the pillar-shaped silicon layer is preferably equal to the sum of the desired height of the pillar-shaped silicon layer and the height of the portion removed during gate line etching. Accordingly, the production steps of the present invention are self-aligned processes.

As shown in FIG. 13, the third resist is removed.

As shown in FIG. 14, the fourth resist 112 is deposited and the polysilicon film 109 on the upper side wall of the pillar-shaped silicon layer 106 is exposed. Preferably, resist etch back is employed. Alternatively, a coating film such as a spin-on-glass may be used.

As shown in FIG. 15, the exposed polysilicon film 109 is removed by etching. Isotropic dry etching is preferably employed.

As shown in FIG. 16, the fourth resist 112 is removed.

Figure 17:
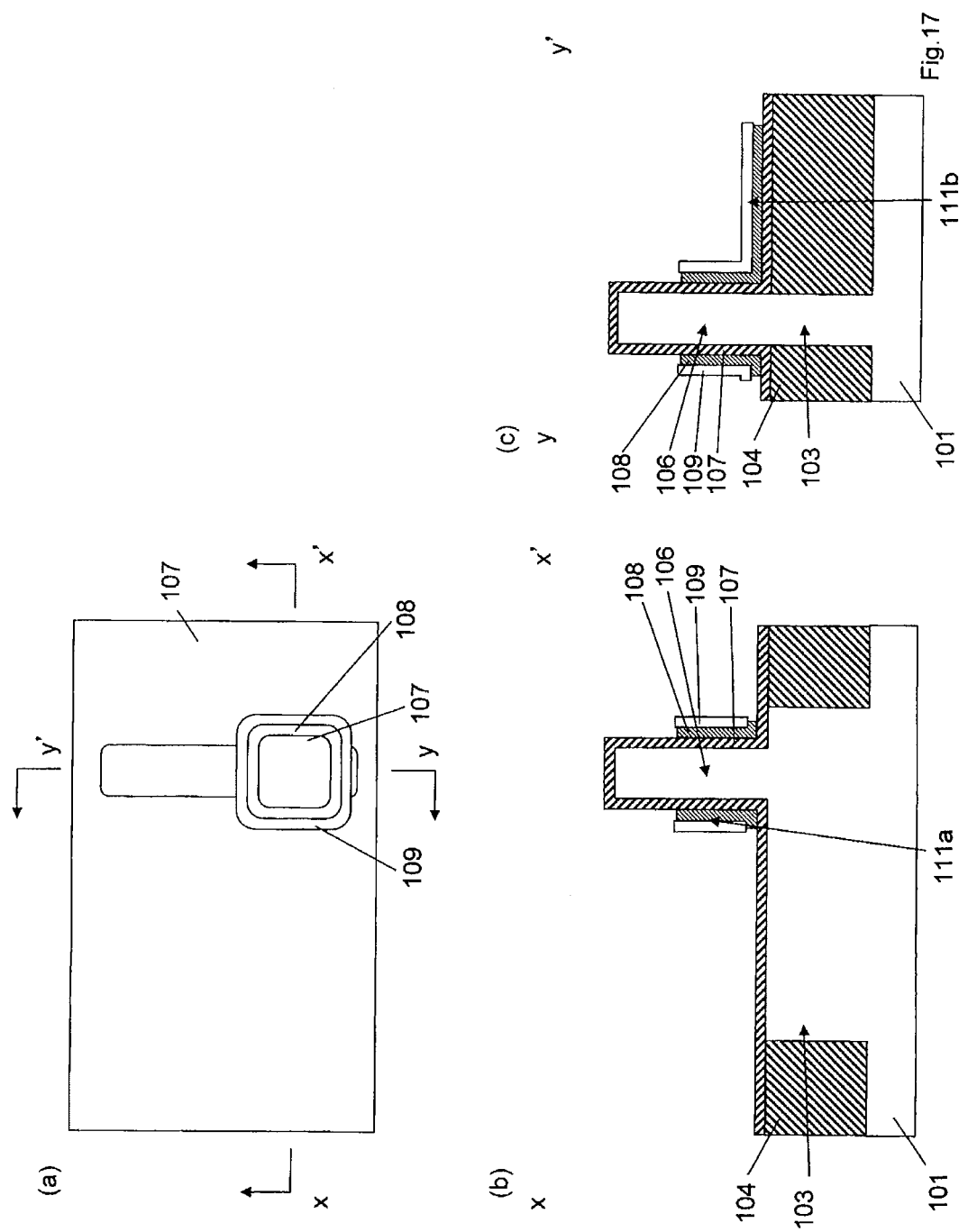
FIG. 17(a) is a plan view of a semiconductor device according to the present invention.
FIG. 17(b) is a cross-sectional view taken along line x-x' in (a).
FIG. 17(c) is a cross-sectional view taken along line y-y' in (a).

As shown in FIG. 17, the metal film 108 is removed by etching so that the metal film 108 remains on the side wall of the pillar-shaped silicon layer 106. Isotropic etching is preferably employed. The metal film 108 and the polysilicon film 109 on the side wall of the pillar-shaped silicon layer 106 form the gate electrode 111*a*. Accordingly, this is a self-aligned process.

This ends the description of the production method in which a gate insulating film 107 is formed around the pillar-shaped silicon layer 106, a metal film 108 and a polysilicon film 109 having a thickness smaller than the width of the pillar-shaped silicon layer are formed around the gate insulating film 107, a third resist 110 for forming a gate line 111*b* is formed and anisotropically etched to form the gate line 111*b*, a fourth resist 112 is then deposited, the polysilicon film 109 on the upper side wall of the pillar-shaped silicon layer 106 is exposed, the exposed polysilicon film 109 is removed by etching, the fourth resist 112 is removed, the metal film 108 is removed by etching, and a gate electrode 111*a* connected to the gate line 111*b* is formed.

Next, a production method is described in which a first diffusion layer 114 is formed in an upper portion of the pillar-shaped silicon layer 106 and a second diffusion layer 113 is formed in a lower portion of the pillar-shaped silicon layer 106 and an upper portion of the fin-shaped silicon layer 103.

As shown in FIG. 18, arsenic is implanted to form the first diffusion layer 114 and the second diffusion layer 113. In the case of pMOS, boron or boron fluoride is implanted.

Figure 19:
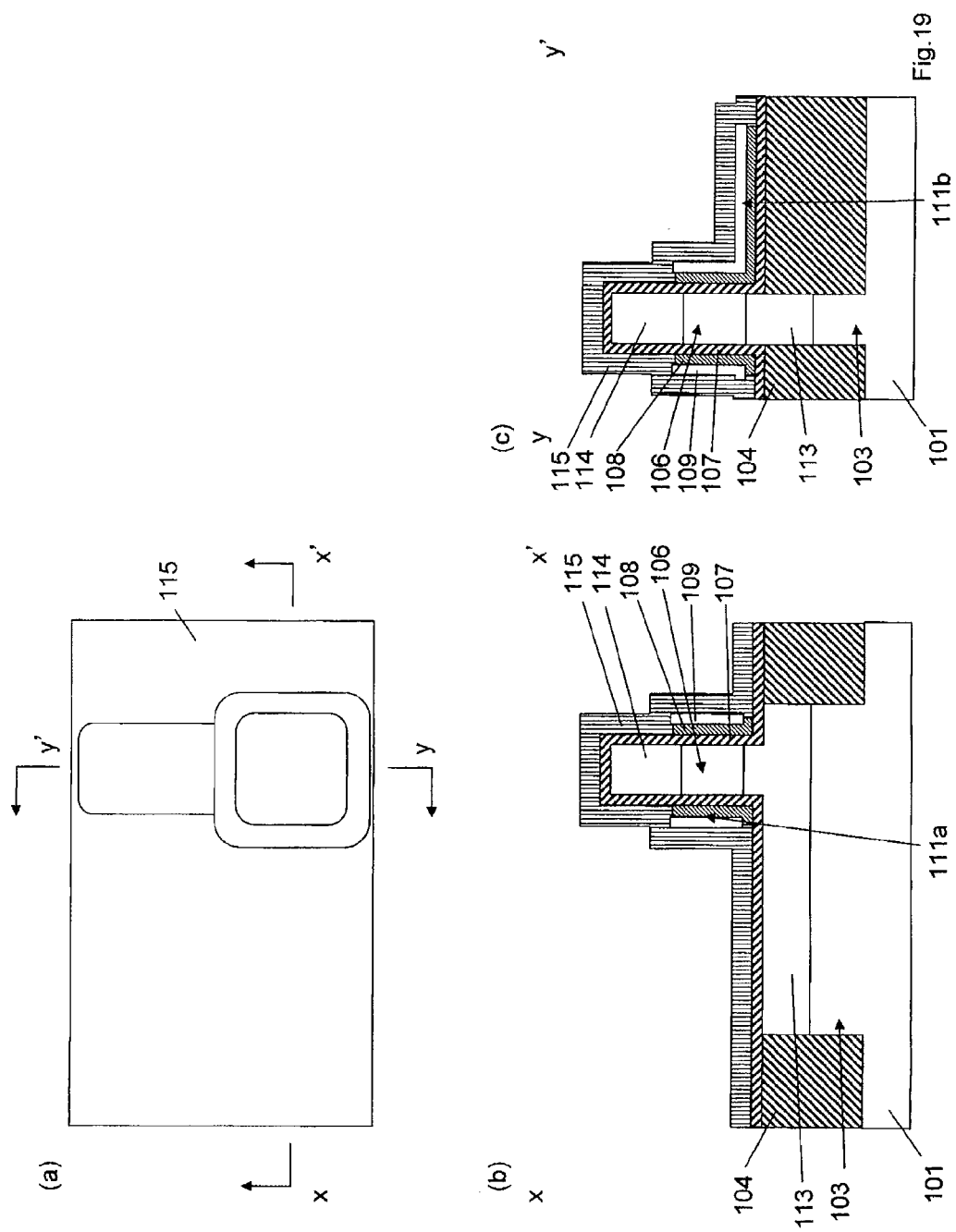
FIG. 19(a) is a plan view of a semiconductor device according to the present invention.
FIG. 19(b) is a cross-sectional view taken along line x-x' in (a).
FIG. 19(c) is a cross-sectional view taken along line y-y' in (a).

As shown in FIG. 19, a nitride film 115 is deposited and a heat treatment is performed. An oxide film may be used instead of a nitride film.

This ends the description of the production method in which a first diffusion layer 114 is formed in an upper portion of the pillar-shaped silicon layer 106 and a second diffusion layer 113 is formed in a lower portion of the pillar-shaped silicon layer 106 and an upper portion of the fin-shaped silicon layer 103.

Next, a production method is described in which a first silicide 118 and a second silicide 117 are formed on the first diffusion layer 114 and the second diffusion layer 113.

As shown in FIG. 20, the nitride film 115 is etched so that the nitride film 115 remains as a side wall and the gate insulating film 107 is etched to form nitride film side walls 116*a* and 116*b*.

Figure 21:
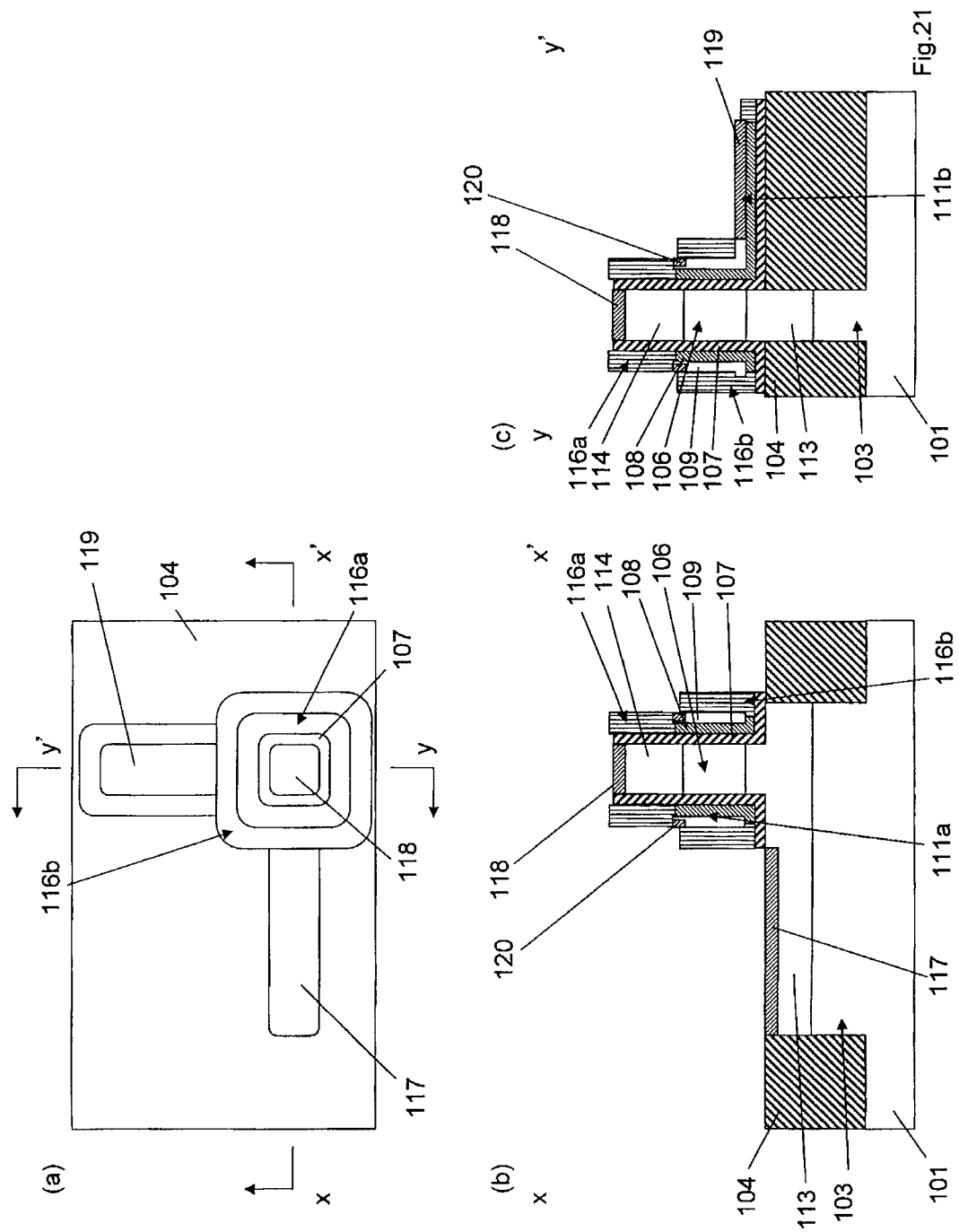
FIG. 21(a) is a plan view of a semiconductor device according to the present invention.
FIG. 21(b) is a cross-sectional view taken along line x-x' in (a).
FIG. 21(c) is a cross-sectional view taken along line y-y' in (a).

Next, as shown in FIG. 21, a metal is deposited and heat-treated and unreacted metal is removed so as to form the first silicide 118, the second silicide 117, and a silicide 119 on the first diffusion layer 114, the second diffusion layer 113, and the gate line 111*b*. In the case where the upper portion of the gate electrode 111*a* is exposed, a silicide 120 is formed in an upper portion of the gate electrode 111*a*.

Since the polysilicon film 109 is thin, the gate line 111*b* tends to have a multilayered structure constituted by the metal film 108 and the silicide 119. Since the silicide 119 and the metal film 108 come into direct contact with each other, the resistance can be decreased.

This ends the description of the production method for forming the first silicide 118 and the second silicide 117 on the first diffusion layer 114, the second diffusion layer 113, and the gate line 111*b*.

Next, a production method in which an interlayer insulating film 121 is deposited, planarized, and etched back to expose an upper portion of the pillar-shaped silicon layer 106, a fifth resist 122 for forming a first contact 127 is formed after the upper portion of the pillar-shaped silicon layer 106 is exposed, the interlayer insulating film 121 is etched to form a contact hole 123, a metal 130 is deposited to form a first contact 127 on the second silicide 117, sixths resists 131, 132, and 133 for forming metal wires 134, 135, and 136 are formed, and etching is performed to form the metal wires 134, 135, and 136.

Figure 22:
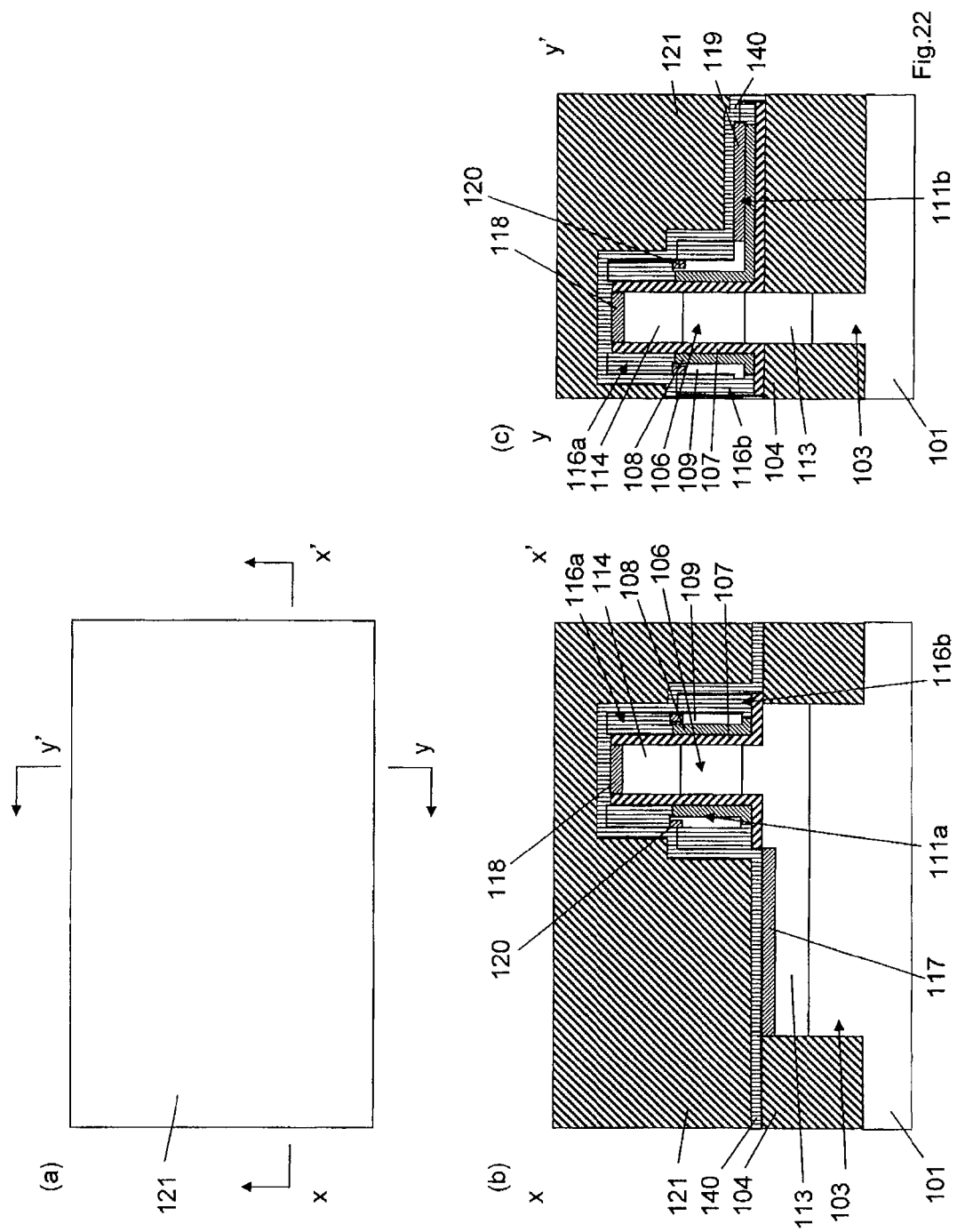
FIG. 22(a) is a plan view of a semiconductor device according to the present invention.
FIG. 22(b) is a cross-sectional view taken along line x-x' in (a).
FIG. 22(c) is a cross-sectional view taken along line y-y' in (a).

As shown in FIG. 22, a contact stopper 140 such as a nitride film is formed and the interlayer insulating film 121 is formed.

Figure 23:
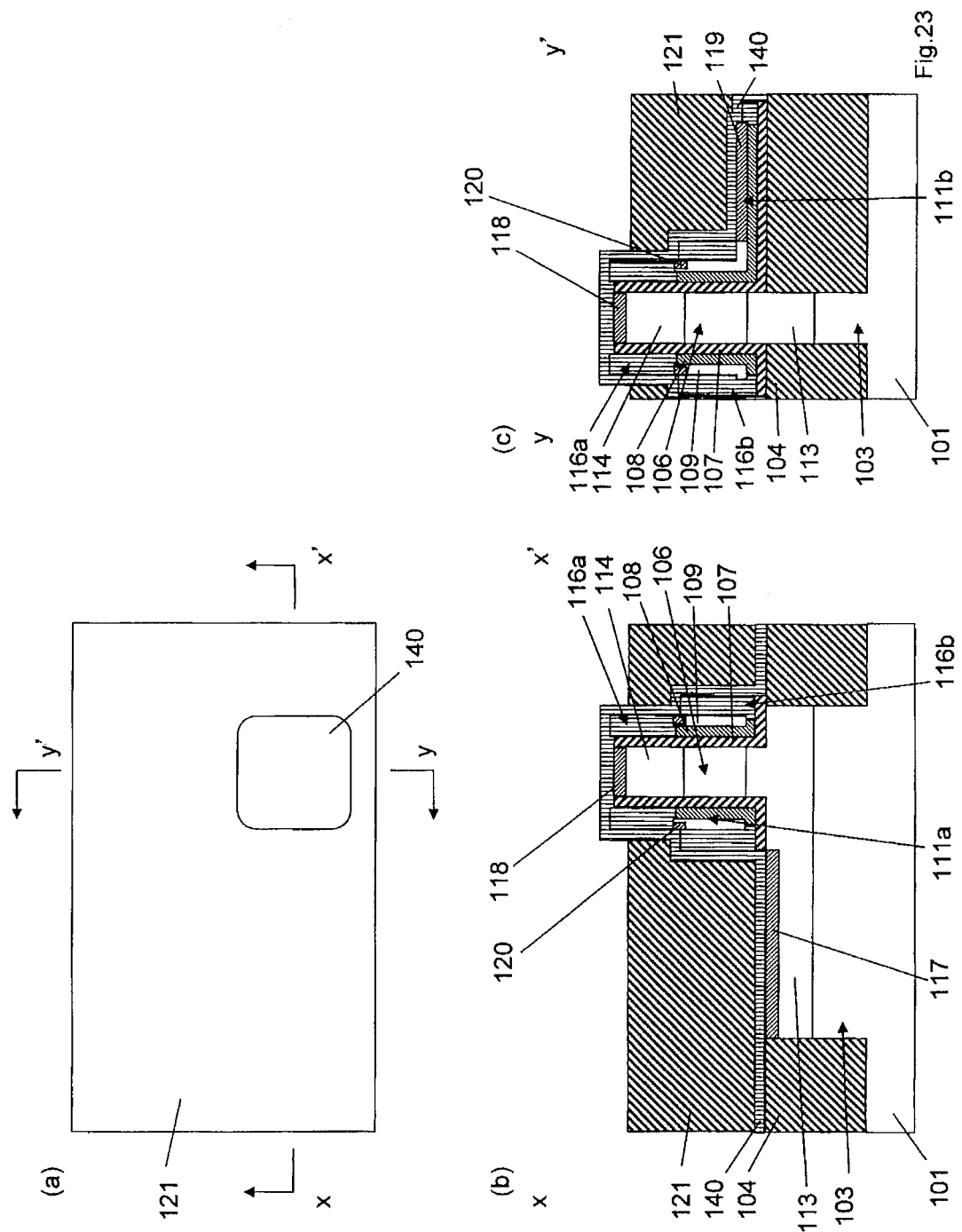
FIG. 23(a) is a plan view of a semiconductor device according to the present invention.
FIG. 23(b) is a cross-sectional view taken along line x-x' in (a).
FIG. 23(c) is a cross-sectional view taken along line y-y' in (a).

As shown in FIG. 23, etch-back is performed to expose the contact stopper 140 on the pillar-shaped silicon layer 106.

Figure 24:
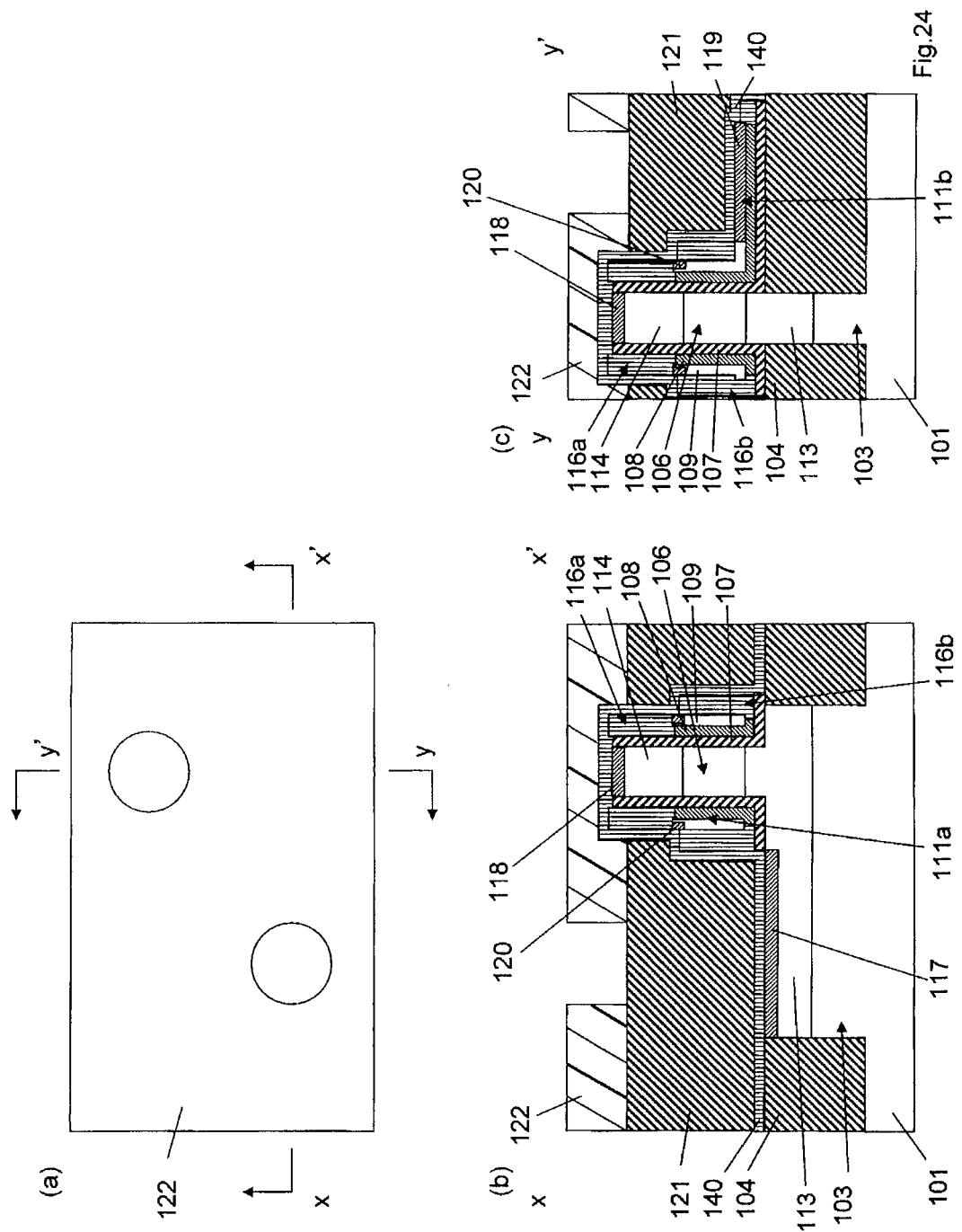
FIG. 24(a) is a plan view of a semiconductor device according to the present invention.
FIG. 24(b) is a cross-sectional view taken along line x-x' in (a).
FIG. 24(c) is a cross-sectional view taken along line y-y' in (a).

As shown in FIG. 24, a fifth resist 122 for forming contact holes 123 and 124 is formed.

Figure 25:
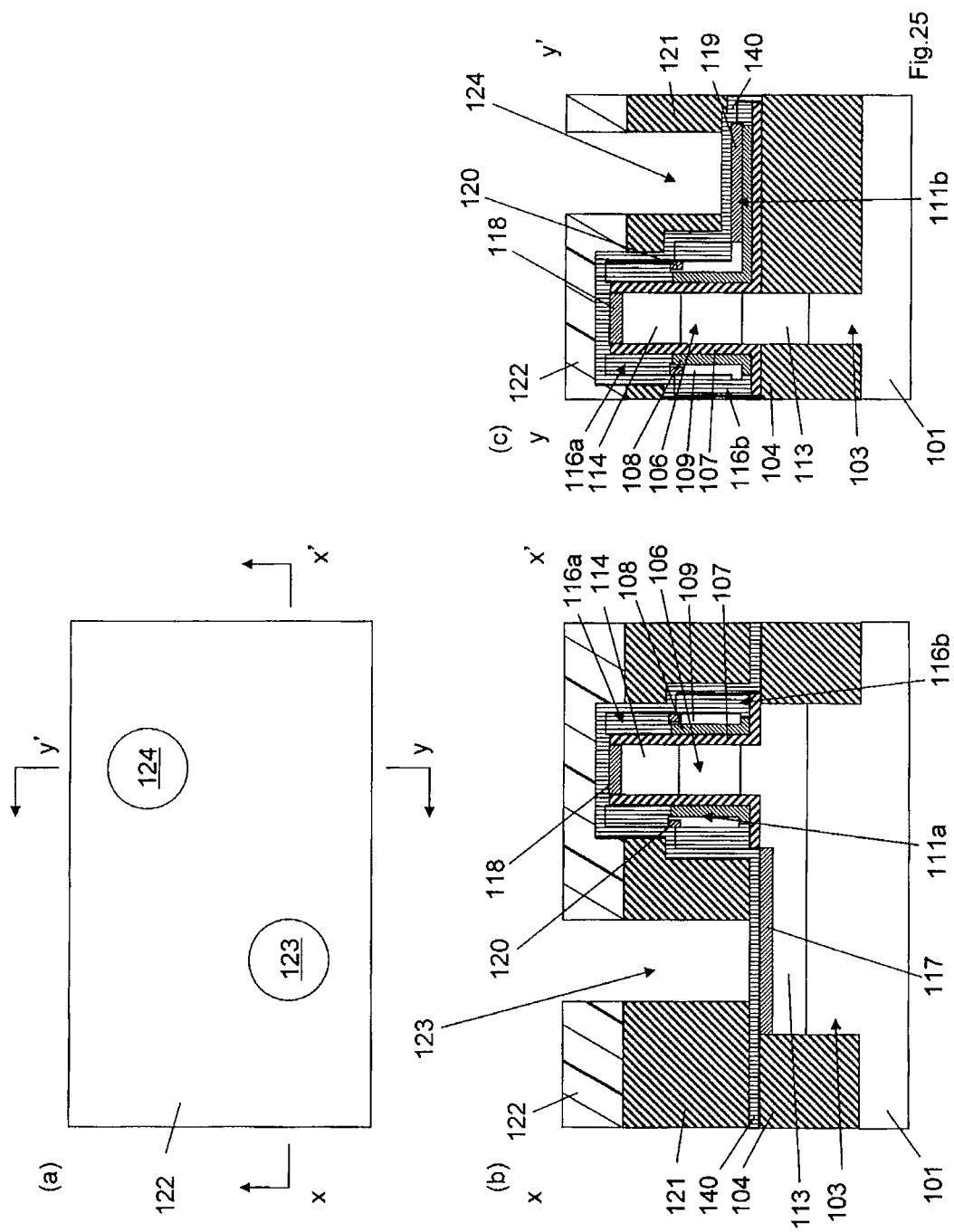
FIG. 25(a) is a plan view of a semiconductor device according to the present invention.
FIG. 25(b) is a cross-sectional view taken along line x-x' in (a).
FIG. 25(c) is a cross-sectional view taken along line y-y' in (a).

As shown in FIG. 25, the interlayer insulating film 121 is etched to form the contact holes 123 and 124.

Figure 26:
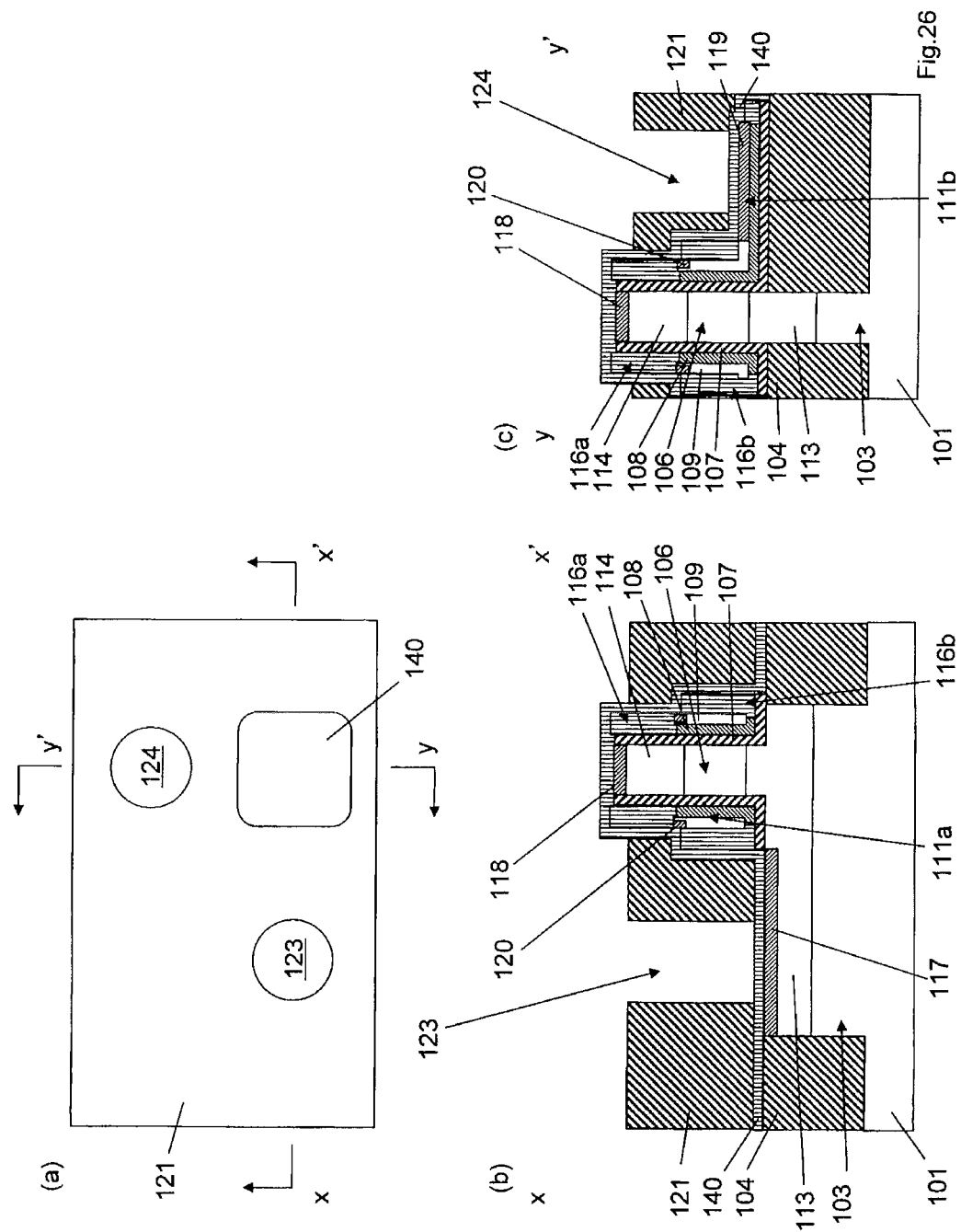
FIG. 26(a) is a plan view of a semiconductor device according to the present invention.
FIG. 26(b) is a cross-sectional view taken along line x-x' in (a).
FIG. 26(c) is a cross-sectional view taken along line y-y' in (a).

As shown in FIG. 26, the fifth resist 122 is removed.

Figure 27:
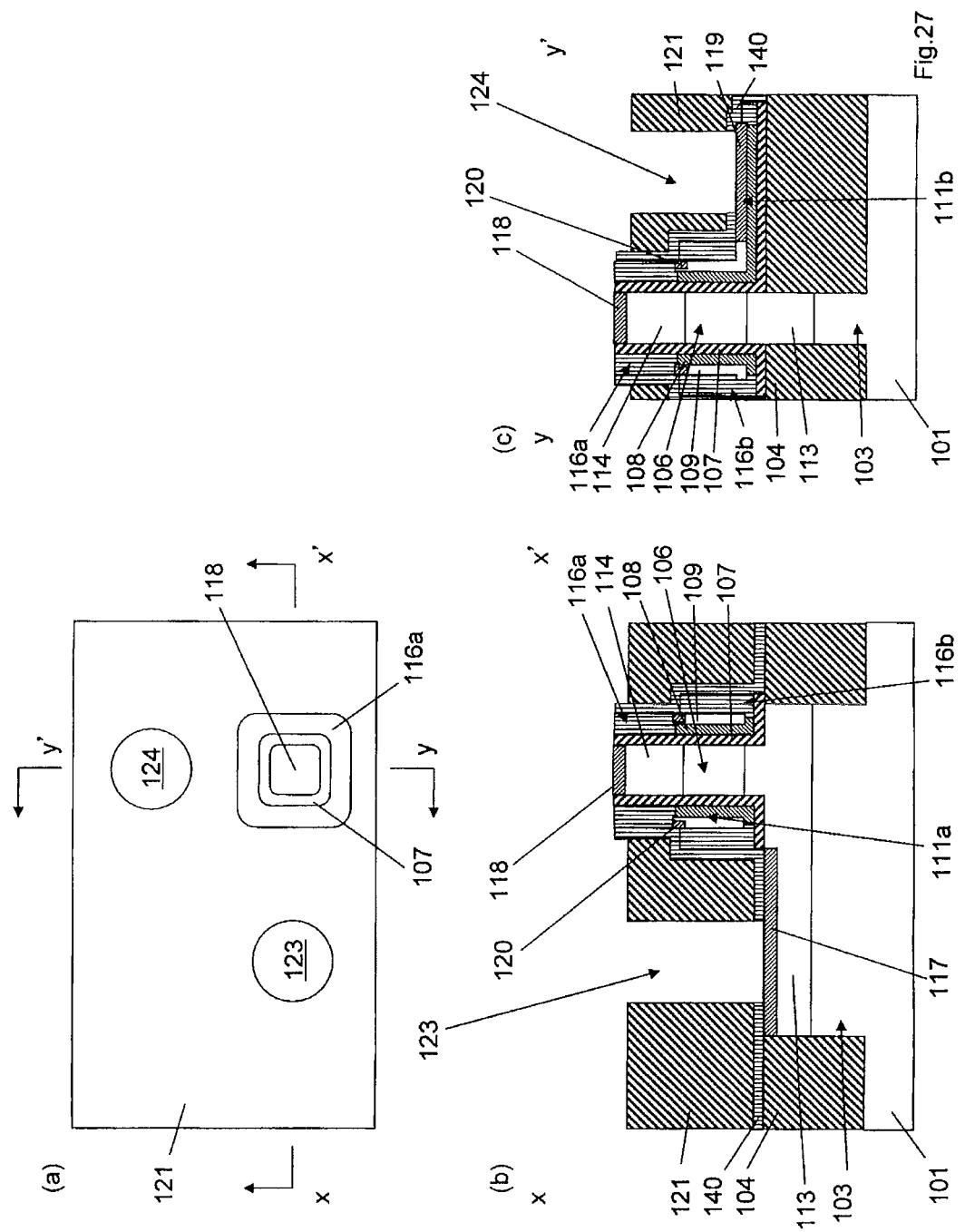
FIG. 27(a) is a plan view of a semiconductor device according to the present invention.
FIG. 27(b) is a cross-sectional view taken along line x-x' in (a).
FIG. 27(c) is a cross-sectional view taken along line y-y' in (a).

As shown in FIG. 27, the contact stopper 140 is etched so as to remove the contact stopper 140 under the contact holes 123 and 124 and the contact stopper on the pillar-shaped silicon layer 106.

Figure 28:
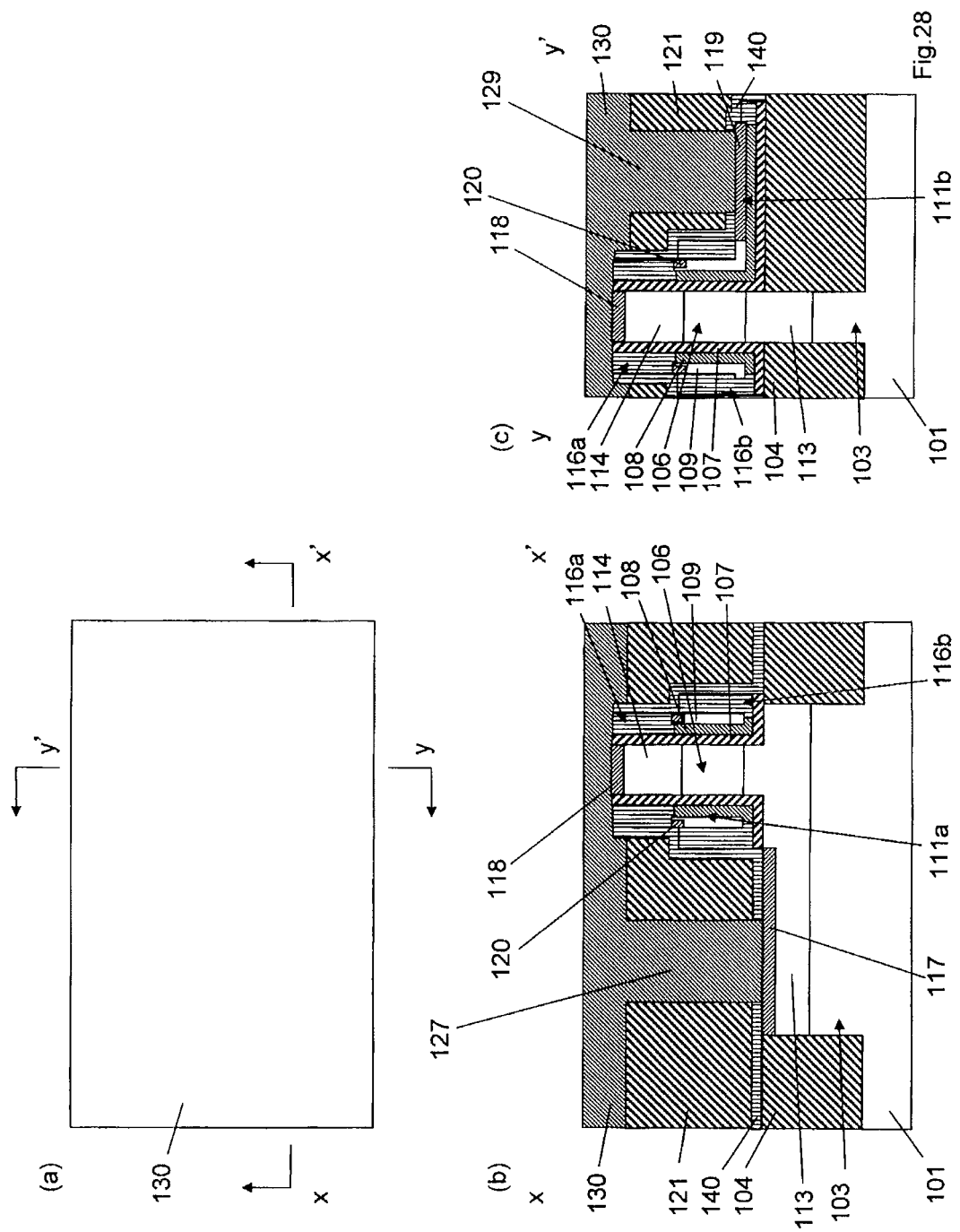
FIG. 28(a) is a plan view of a semiconductor device according to the present invention.
FIG. 28(b) is a cross-sectional view taken along line x-x' in (a).
FIG. 28(c) is a cross-sectional view taken along line y-y' in (a).

As shown in FIG. 28, the metal 130 is deposited to form first contacts 127 and 129. Since the metal wire and the upper portion of the pillar-shaped silicon layer are directly connected to each other during this process, the step of forming a contact in the upper portion of the pillar-shaped silicon layer is no longer necessary. Moreover, since the depth of the contact hole for forming a first contact can be decreased, it is easier to form a contact hole and to fill the contact hole with a metal.

Figure 29:
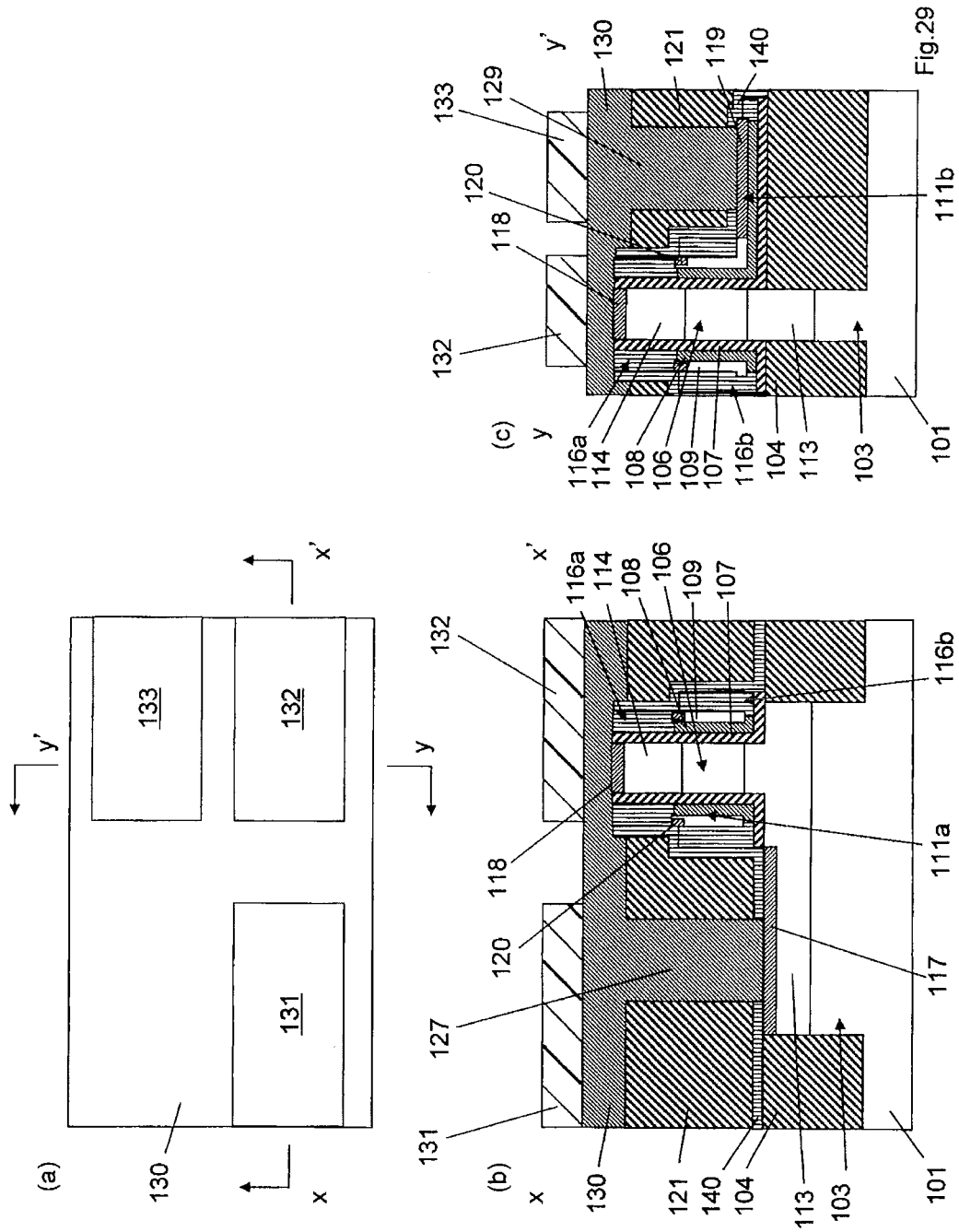
FIG. 29(a) is a plan view of a semiconductor device according to the present invention.
FIG. 29(b) is a cross-sectional view taken along line x-x' in (a).
FIG. 29(c) is a cross-sectional view taken along line y-y' in (a).

As shown in FIG. 29, the sixths resists 131, 132, and 133 for forming metal wires are formed.

Figure 30:
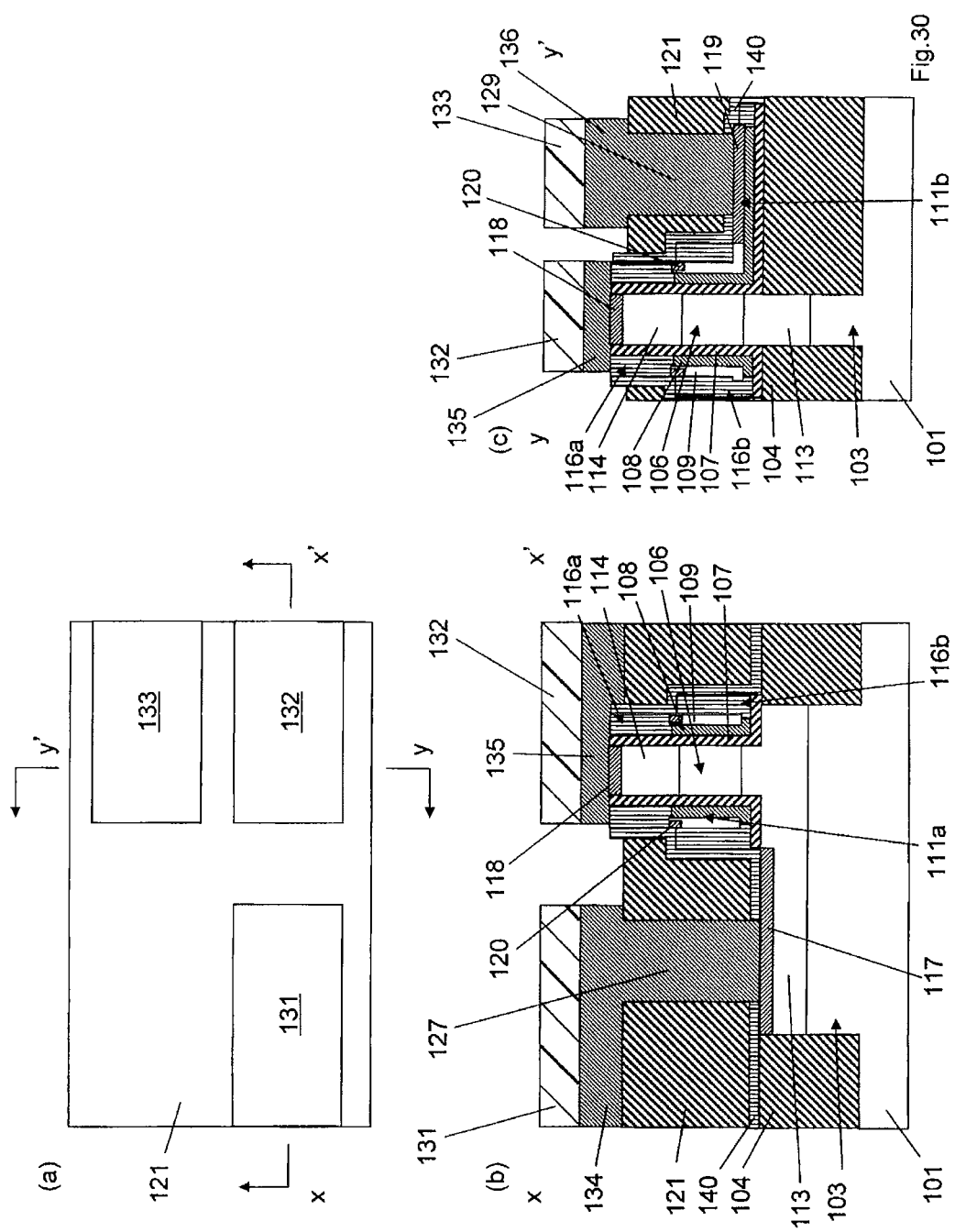
FIG. 30(a) is a plan view of a semiconductor device according to the present invention.
FIG. 30(b) is a cross-sectional view taken along line x-x' in (a).
FIG. 30(c) is a cross-sectional view taken along line y-y' in (a).

As shown in FIG. 30, the metal 130 is etched to form the metal wires 134, 135, and 136.

As shown in FIG. 31, the sixths resists 131, 132, and 133 are removed.

This ends the description of the production method in which the interlayer insulating film 121 is deposited, planarized, and etched back, an upper portion of the pillar-shaped silicon layer 106 is exposed, a fifth resist 122 for forming a first contact 127 is formed after the upper portion of the pillar-shaped silicon layer 106 is exposed, a contact hole 123 is formed by etching the interlayer insulating film 121, a first contact 127 is formed on the second silicide 117 by depositing a metal 130, and sixths resists 131, 132, and 133 for forming metal wires 134, 135, and 136 are formed, and etching is performed to form the metal wires 134, 135, and 136.

This ends the description of a method for producing a SGT in which a parasitic capacitance between a gate line and a substrate is reduced, no contact is formed in an upper portion of a pillar-shaped silicon layer, and a metal wire is directly connected to the upper portion of the pillar-shaped silicon layer.

FIG. 1 shows a structure of a semiconductor device obtained through the production method described above. As shown in FIG. 1, the semiconductor device includes a fin-shaped silicon layer 103 formed on a silicon substrate 101, a first insulating film 104 formed around the fin-shaped silicon layer 103, a pillar-shaped silicon layer 106 formed on the fin-shaped silicon layer 103 having a width equal to the width of the pillar-shaped silicon layer 106, a gate insulating film 107 formed around the pillar-shaped silicon layer 106, a gate electrode 111a formed around the gate insulating film 107, a gate line 111b extending in a direction orthogonally intersecting the fin-shaped silicon layer 103 and being connected to the gate electrode 111a, a first diffusion layer 114 formed in an upper portion of the pillar-shaped silicon layer 106, a second diffusion layer 113 formed in an upper portion of the fin-shaped silicon layer 103 and a lower portion of the pillar-shaped silicon layer 106, a first silicide 118 formed in an upper portion of the first diffusion layer 114, a second silicide 117 formed in an upper portion of the second diffusion layer 113, a first contact 127 formed on the second silicide 117, a first metal wire 135 formed on the first silicide 118, and a second metal wire 134 formed on the first contact 127.

The semiconductor device also includes a gate electrode 111a which has a multilayered structure constituted by a metal film 108 and a polysilicon film 109 formed around the gate insulating film 107. The thickness of the polysilicon film 109 is smaller than the width of the pillar-shaped silicon layer 106.

The depth of the first contact 127 is smaller than the height of the pillar-shaped silicon layer 106. Since the depth of the first contact 127 is small, the first contact resistance can be decreased.

It should be noted that various embodiments and modifications are possible without departing from the spirit and scope of the present invention in a broad sense. Moreover, the embodiments described above are for explaining examples of the present invention and do not limit the scope of the present invention.

For example, a method for producing a semiconductor device in which p-type (p+ type is also included) and n-type (n+ type is also included) are reversed from that described in the embodiments described above, and a semiconductor device obtained by such a method are also within the technical scope of the present invention.

The invention claimed is:

1. A semiconductor device comprising:
   a fin-shaped silicon layer on a silicon substrate;
   a first insulating film around the fin-shaped silicon layer;
   a pillar-shaped silicon layer on the fin-shaped silicon layer;
   a gate insulating film around the pillar-shaped silicon layer;
   a gate electrode around the gate insulating film;
   a gate line connected to the gate electrode and extending in a direction orthogonally intersecting the fin-shaped silicon layer;
   a first diffusion layer in an upper portion of the pillar-shaped silicon layer;
   a second diffusion layer in an upper portion of the fin-shaped silicon layer and a lower portion of the pillar-shaped silicon layer;
   a first silicide in an upper portion of the first diffusion layer;
   a second silicide in an upper portion of the second diffusion layer;
   a first contact on the second silicide;
   a first metal wire on the first silicide; and
   a second metal wire on the first contact.

2. The semiconductor device according to claim 1 further comprising a gate electrode having a laminated structure comprising a metal film and a polysilicon film, the gate electrode around the gate insulating film, wherein a thickness of the polysilicon film is smaller than a width of the pillar-shaped silicon layer.

3. The semiconductor device according to claim 1, wherein a depth of the first contact is smaller than a height of the pillar-shaped silicon layer.

* * * * *